(12) United States Patent
Hwang et al.

(10) Patent No.: US 12,745,421 B2
(45) Date of Patent: Sep. 22, 2026

(54) SEMICONDUCTOR DEVICE

(71) Applicant: SAMSUNG ELECTRONICS CO., LTD., Suwon-si (KR)

(72) Inventors: Donghoon Hwang, Suwon-si (KR); Hyojin Kim, Suwon-si (KR); Byungho Moon, Suwon-si (KR); Myungil Kang, Suwon-si (KR); Wooseok Park, Suwon-si (KR); Jaeho Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 383 days.

(21) Appl. No.: 18/500,499

(22) Filed: Nov. 2, 2023

(65) Prior Publication Data

US 2024/0347609 A1 Oct. 17, 2024

(30) Foreign Application Priority Data

Apr. 17, 2023 (KR) ........................ 10-2023-0050278

(51) Int. Cl.

| | |
|---|---|
| ***H01L 23/367*** | (2006.01) |
| ***H01L 29/66*** | (2006.01) |
| ***H01L 29/78*** | (2006.01) |
| ***H10D 30/43*** | (2025.01) |
| ***H10D 30/67*** | (2025.01) |
| ***H10D 62/10*** | (2025.01) |
| ***H10D 62/13*** | (2025.01) |

(52) U.S. Cl.
CPC ......... *H10D 30/6729* (2025.01); *H10D 30/43* (2025.01); *H10D 30/6735* (2025.01); *H10D 30/6757* (2025.01); *H10D 62/121* (2025.01); *H10D 62/151* (2025.01)

(58) Field of Classification Search
CPC . H10D 62/121; H10D 62/151; H10D 30/6735
See application file for complete search history.

(56) References Cited

U.S. PATENT DOCUMENTS

| | | | | |
|---|---|---|---|---|
| 11,664,377 | B2 | 5/2023 | Lilak et al. | |
| 2021/0036121 | A1* | 2/2021 | Lim | H10D 62/151 |
| 2022/0102520 | A1 | 3/2022 | Shiliang et al. | |
| 2024/0105805 | A1* | 3/2024 | Liang | H10D 84/0151 |
| 2025/0142906 | A1* | 5/2025 | Jang | H10D 30/6735 |

FOREIGN PATENT DOCUMENTS

| | | |
|---|---|---|
| CN | 113809011 | 12/2021 |
| CN | 115036370 | 9/2022 |

* cited by examiner

*Primary Examiner* — Victoria K. Hall
(74) *Attorney, Agent, or Firm* — Morgan, Lewis & Bockius LLP

(57) ABSTRACT

A semiconductor device includes a substrate including an active pattern, first and second source/drain patterns overlapping with the active pattern, a separation insulating layer between the first and second source/drain patterns, and first and second gate electrodes spaced apart from each other with the separation insulating layer interposed therebetween. A level of a top surface of the separation insulating layer is higher than a level of a top surface of the first gate electrode and a level of a top surface of the second gate electrode.

18 Claims, 35 Drawing Sheets

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2023-0050278, filed on Apr. 17, 2023, in the Korean Intellectual Property Office, the entire contents of which are hereby incorporated by reference.

BACKGROUND OF THE INVENTION

The present disclosure relates to a semiconductor device, and more particularly, to a semiconductor device including a source/drain pattern.

A semiconductor device may include an integrated circuit including metal-oxide-semiconductor field effect transistors (MOSFETs). As sizes and design rules of semiconductor devices have been reduced, MOSFETs have been scaled down. The reduction in size of the device features in MOSFETs can cause a reduction in device performance. Accordingly, research has been conducted for overcoming operating characteristic reductions introduced to semiconductor devices due to a high integration density, and for improving performance of such semiconductor devices.

SUMMARY

Embodiments of the inventive concepts may provide a semiconductor device with improved electrical characteristics and reliability.

In an aspect, a semiconductor device may include a first source/drain pattern and a second source/drain pattern which overlap with an active pattern of a substrate, a separation insulating layer between the first source/drain pattern and the second source/drain pattern, and a first gate electrode and a second gate electrode which are spaced apart from each other with the separation insulating layer interposed therebetween. A level of a top surface of the separation insulating layer may be higher than a level of a top surface of the first gate electrode and a level of a top surface of the second gate electrode.

In an aspect, a semiconductor device may include a substrate including a first active pattern and a second active pattern, which are adjacent to each other, first source/drain patterns overlapping the first active pattern, second source/drain patterns overlapping the second active pattern, a first gate electrode between the first source/drain patterns, a second gate electrode between the second source/drain patterns, a first separation insulating layer adjoining the first source/drain patterns, a second separation insulating layer adjoining the second source/drain patterns, and a gate separation pattern in direct contact with the first and second gate electrodes. The gate separation pattern may separate the first and second gate electrodes from each other.

In an aspect, a semiconductor device may include a substrate including an active pattern, first source/drain patterns overlapping the active pattern, second source/drain patterns overlapping the active pattern, a first channel pattern between the first source/drain patterns, a second channel pattern between the second source/drain patterns, a first gate electrode between the first source/drain patterns, a second gate electrode between the second source/drain patterns, and a separation insulating layer between the first source/drain patterns and the second source/drain patterns. Each of the first channel pattern and the second channel pattern may include semiconductor patterns overlapping with each other in a vertical direction.

BRIEF DESCRIPTION OF THE DRAWINGS

FIG. 1C is a cross-sectional view taken along a line B-B' of FIG. 1A.

FIG. 1D is a cross-sectional view taken along a line C-C' of FIG. 1A.

FIGS. 2A, 2B, 2C, 3A, 3B, 3C, 4A, 4B, 4C, 5A, 5B, 5C, 5D, 6A, 6B, 6C, 6D, 7A, 7B, 7C, 7D, 8, 9, 10A, 10B, 10C and 10D are cross-sectional views illustrating a method of manufacturing the semiconductor device according to FIGS. 1A to 1F.

DETAILED DESCRIPTION

Figure 1A:
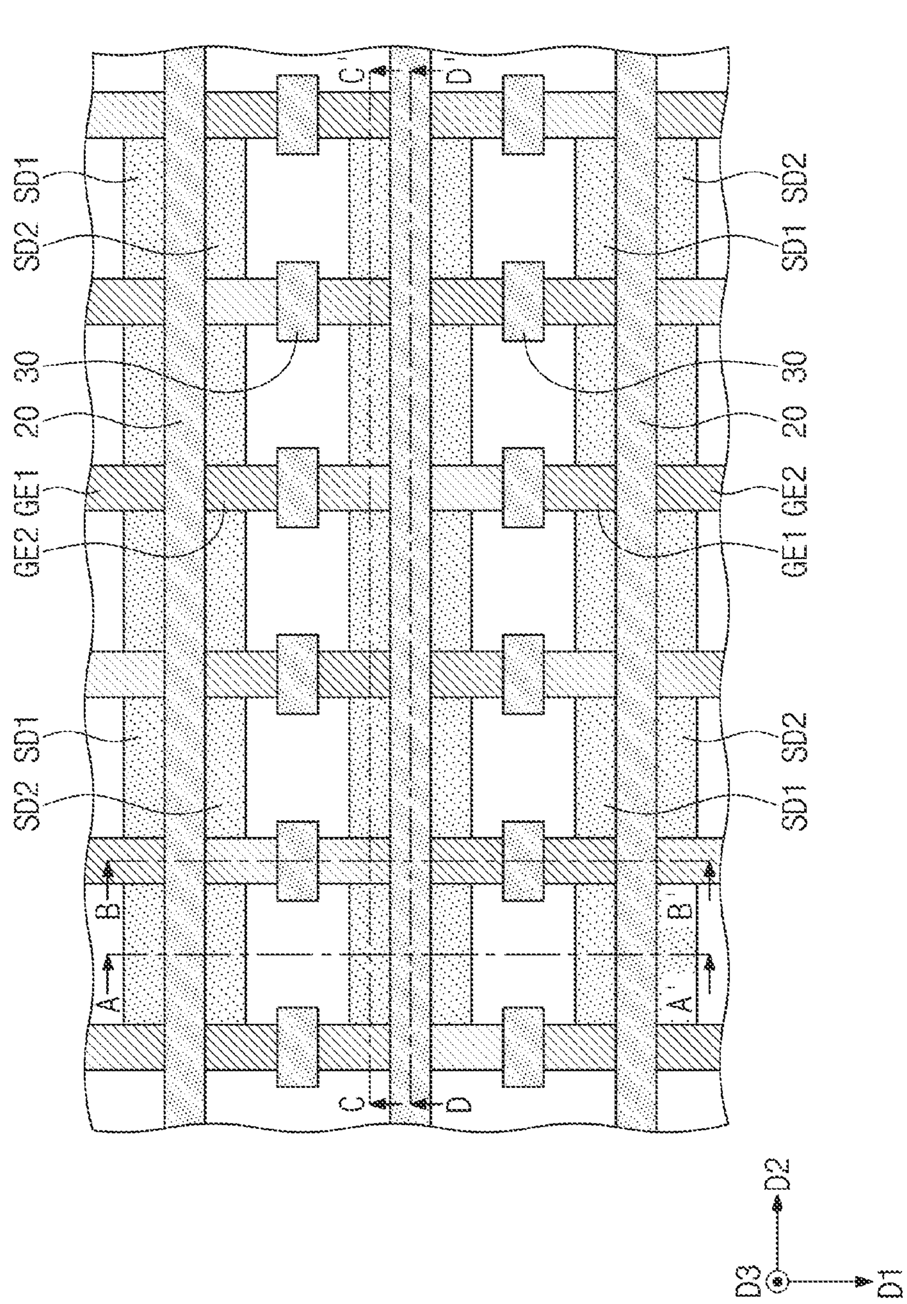
FIG. 1A is a plan view illustrating a semiconductor device, according to various embodiments of the inventive concepts.
Figure 1B:
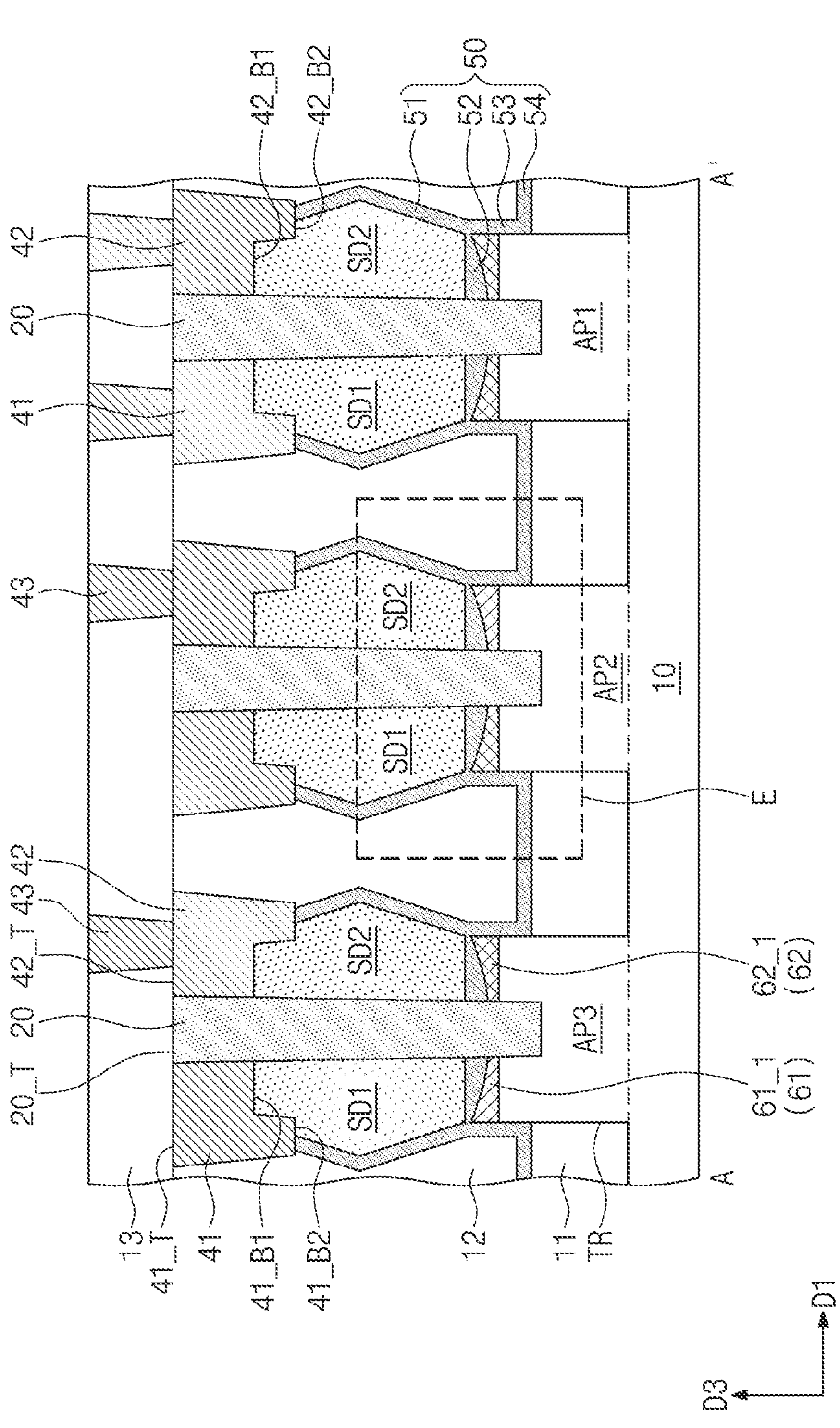
FIG. 1B is a cross-sectional view taken along a line A-A' of FIG. 1A.
Figure 1C:
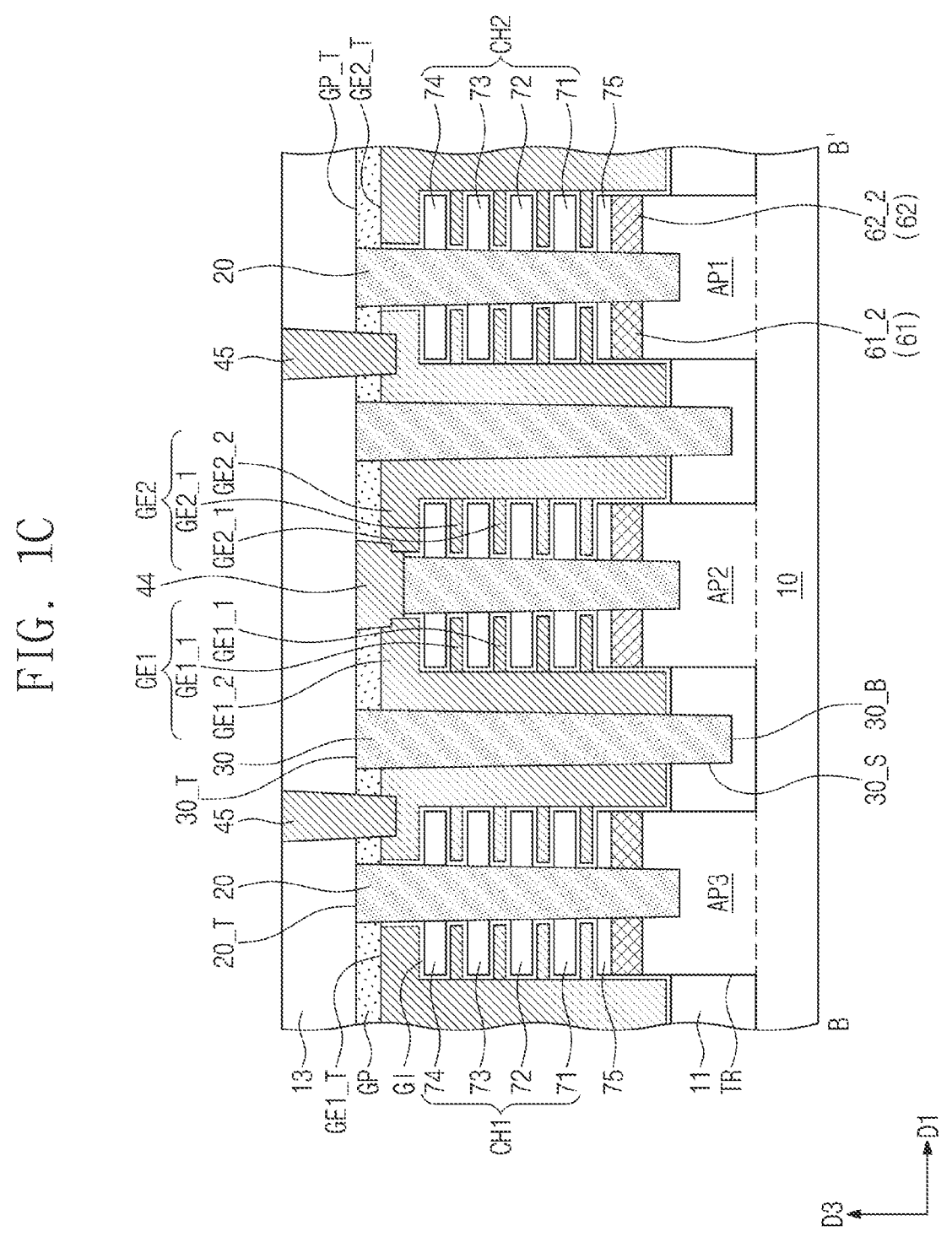
Figure 1D:
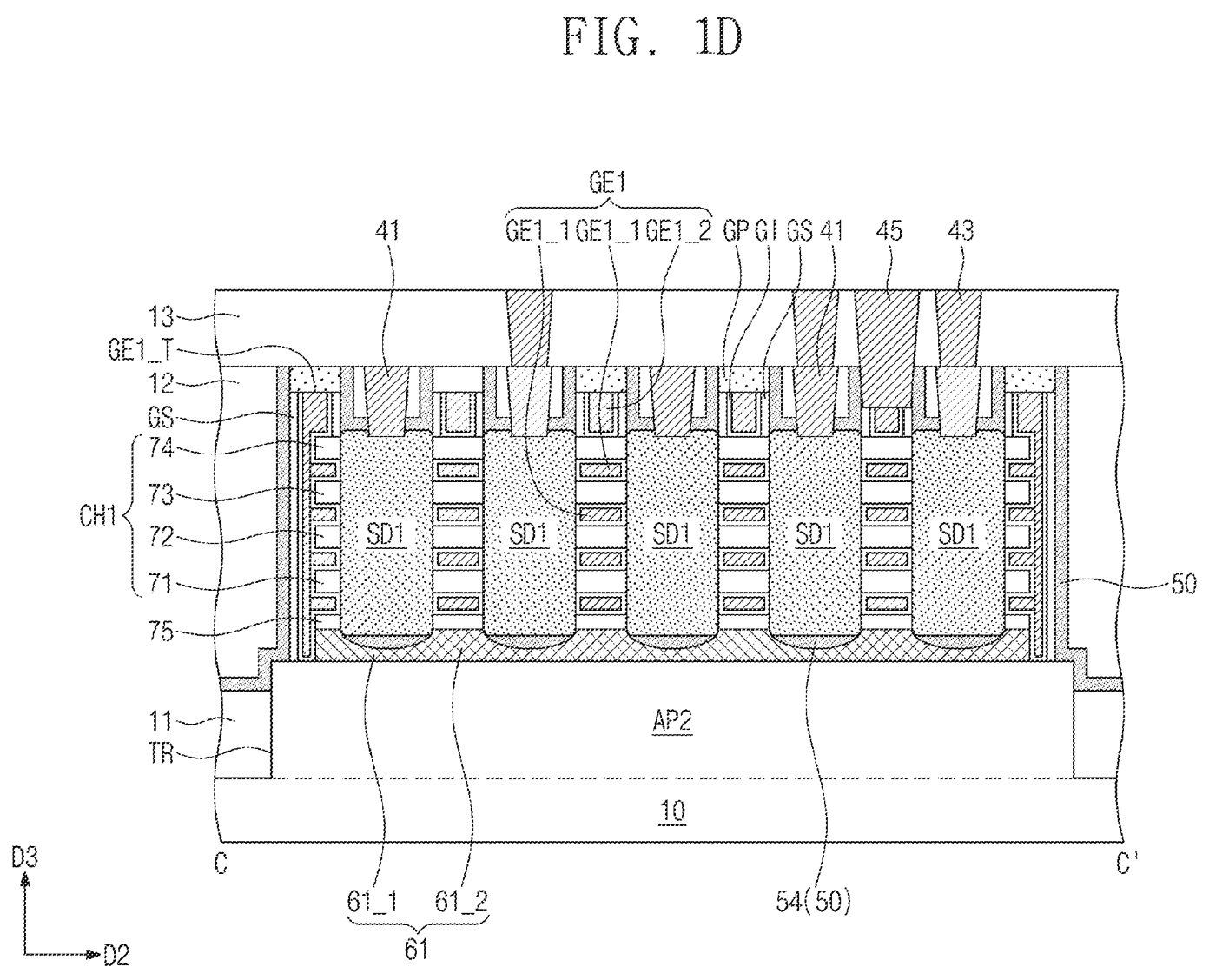
Figure 1E:
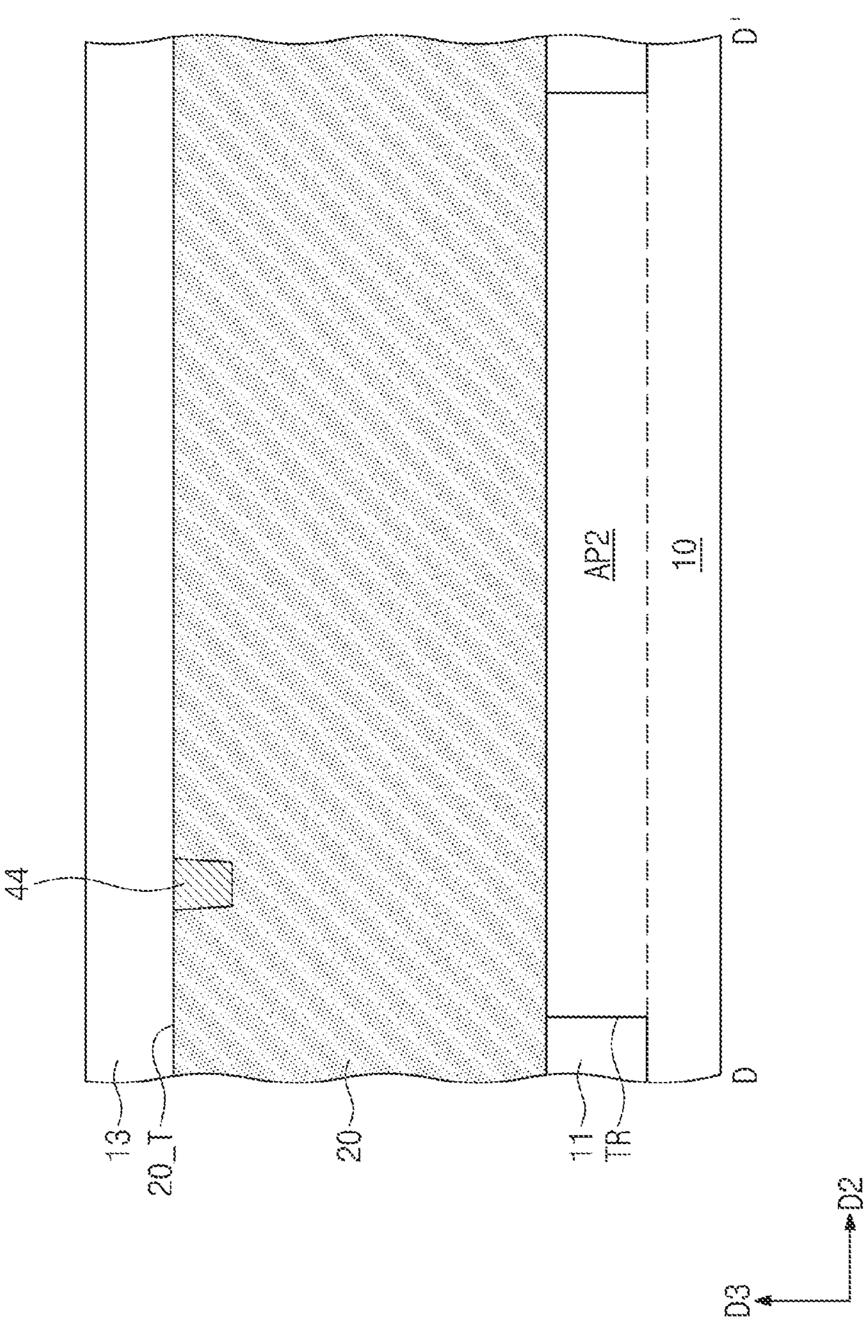
FIG. 1E is a cross-sectional view taken along a line D-D' of FIG. 1A.
Figure 1F:
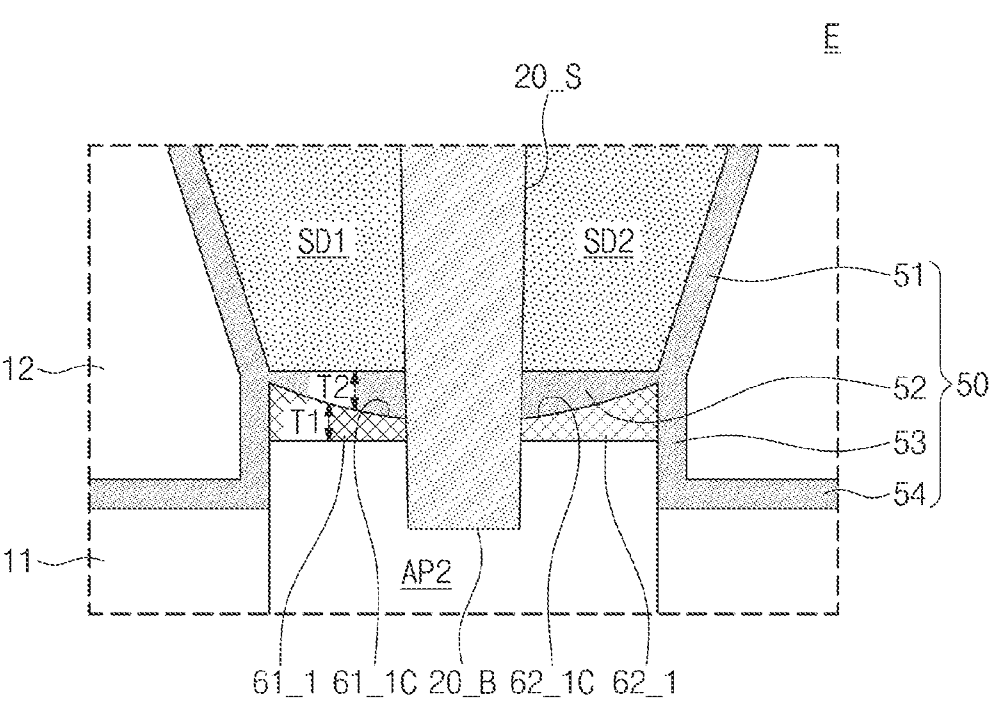
FIG. 1F is an enlarged view illustrating a region 'E' of FIG. 1B.
Figure 1F:
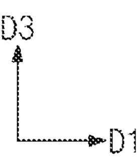

FIG. 1A is a plan view illustrating a semiconductor device, according to various embodiments of the inventive concepts. FIG. 1B is a cross-sectional view taken along a line A-A' of FIG. 1A. FIG. 1C is a cross-sectional view taken along a line B-B' of FIG. 1A. FIG. 1D is a cross-sectional view taken along a line C-C' of FIG. 1A. FIG. 1E is a cross-sectional view taken along a line D-D' of FIG. 1A. FIG. 1F is an enlarged view illustrating a region 'E' of FIG. 1B.

Referring to FIGS. 1A, 1B, 1C, 1D and 1E, a semiconductor device may include a substrate 10, where the substrate can provide support and active regions for one or more devices. The devices can include a plurality of logic transistors formed on the substrate 10, where the logic transistors can be configured as a logic circuit disposed on the substrate 10. In various embodiments, the substrate 10 may be a semiconductor substrate, where for example, the substrate 10 may include silicon, germanium, silicon-germanium, GaP, or GaAs. In various embodiments, the substrate 10 may be a silicon-on-insulator (SOI) substrate or a germanium-on-insulator (GOI) substrate. The substrate 10 may have a plate shape extending along a plane defined by a first direction D1 and a second direction D2, where the first direction D1 and the second direction D2 may intersect each other. For example, the first direction D1 and the second direction D2 may be horizontal directions perpendicular to each other.

Referring to FIG. 1A, separation insulating layers 20 may be formed on a substrate 10, where the separation insulating layers 20 may be adjacent to first source/drain patterns SD1 and second source/drain patterns SD2. The first source/drain patterns SD1 and second source/drain patterns SD2 may be in physical contact with the separation insulating layer 20. A first gate electrode GE1 may be disposed between the first source/drain patterns SD1 adjacent to each other in the second direction D2, and a second gate electrode GE2 may be disposed between the second source/drain patterns SD2 adjacent to each other in the second direction D2. A plurality of the gate separation patterns 30 may be disposed between the separation insulating layers 20 adjacent to each other in the first direction D1.

Referring to FIG. 1B, the substrate 10 may include active patterns AP1, AP2 and AP3, where the active patterns AP1, AP2 and AP3 may include a first active pattern AP1, a second active pattern AP2, and a third active pattern AP3. The active patterns AP1, AP2 and AP3 may be arranged in the first direction D1, where the first to third active patterns AP1, AP2 and AP3 may be spaced apart on the substrate 10 in the first direction D1. Each of the active patterns AP1, AP2 and AP3 may extend in the second direction D2. The second active pattern AP2 may be between and adjacent to the first active pattern AP1 and the third active pattern AP3, where the first active pattern AP1 and the second active pattern AP2 can be an adjacent pair of active patterns.

In various embodiments, each of the active patterns AP1, AP2 and AP3 may be formed by an upper portion of the substrate 10, which protrudes in a third direction D3 from a lower portion of the substrate 10. The third direction D3 may intersect the first direction D1 and the second direction D2, where for example, the third direction D3 may be a vertical direction perpendicular to the first direction D1 and the second direction D2.

In various embodiments, the active patterns AP1, AP2 and AP3 may be defined by a trench TR on the substrate 10. A device isolation layer 11 may be provided on the substrate 10, where the device isolation layer 11 may fill the trench TR. The device isolation layer 11 may include an insulating material, where for example, the device isolation layer 11 may include an oxide.

In various embodiments, the first and second source/drain patterns SD1 and SD2 may be epitaxial patterns formed by a selective epitaxial growth (SEG) process. The first and second source/drain patterns SD1 and SD2 may include silicon (Si) or silicon-germanium (SiGe).

In some embodiments, the first source/drain pattern SD1 overlapping with the first active pattern AP1 in the third direction D3, the second source/drain pattern SD2 overlapping with the second active pattern AP2 in the third direction D3, and the first source/drain pattern SD1 overlapping with the third active pattern AP3 in the third direction D3 may be doped with dopants to have a first conductivity type, and the second source/drain pattern SD2 overlapping with the first active pattern AP1 in the third direction D3, the first source/drain pattern SD1 overlapping with the second active pattern AP2 in the third direction D3 and the second source/drain pattern SD2 overlapping with the third active pattern AP3 in the third direction D3 may be doped with dopants to have a second conductivity type different from the first conductivity type. For example, the first conductivity type may be an N-type or a P-type, and the second conductivity type may be a P-type or an N-type, where the second conductivity type may be the opposite of the first conductivity type.

In various embodiments, the first and second source/drain patterns SD1 and SD2 overlapping with the first active pattern AP1 in the third direction D3 and the first and second source/drain patterns SD1 and SD2 overlapping with the third active pattern AP3 in the third direction D3 may be doped with dopants to have the first conductivity type, and the first and second source/drain patterns SD1 and SD2 overlapping with the second active pattern AP2 in the third direction D3 may be doped with dopants to have the second conductivity type different from the first conductivity type. The second conductivity type may be a P-type or an N-type, where the second conductivity type may be the opposite of the first conductivity type.

In various embodiments, a first lower insulating pattern 61 and a second lower insulating pattern 62 may be provided on each of the active patterns AP1, AP2 and AP3. The first and second lower insulating patterns 61 and 62 may be in contact with a top surface of each of the active patterns AP1, AP2 and AP3. The first lower insulating pattern 61 may be provided between each of the active patterns AP1, AP2 and AP3 and the first source/drain patterns SD1, and the second lower insulating pattern 62 may be provided between each of the active patterns AP1, AP2 and AP3 and the second source/drain patterns SD2.

In various embodiments, the first and second lower insulating patterns 61 and 62 may include an insulating material. For example, each of the first and second lower insulating patterns 61 and 62 may include a first layer including silicon carbo-oxynitride, and a second layer including silicon oxide or silicon nitride, where the first layer may surround the second layer.

The first lower insulating pattern 61 may include first portions 61_1 and second portions 61_2. The first portion 61_1 of the first lower insulating pattern 61 may overlap with the first source/drain pattern SD1 in the third direction D3. The second portion 61_2 of the first lower insulating pattern 61 may overlap with the first channel pattern CH1 in the third direction D3. The first portions 61_1 and the second portions 61_2 of the first lower insulating pattern 61 may be alternately arranged in the second direction D2.

In various embodiments, each of the separation insulating layers 20 may be provided on each of the active patterns AP1, AP2 and AP3, where the separation insulating layers 20 may extend into the active patterns AP1, AP2 and AP3. A first separation insulating layer 20 may be provided on the first active pattern AP1, a second separation insulating layer 20 may be provided on the second active pattern AP2, and a third separation insulating layer 20 may be provided on the third active pattern AP3. The separation insulating layer 20 may extend in the second direction D2 and the third direction D3. The separation insulating layer 20 may include an insulating material. For example, the separation insulating layer 20 may include silicon nitride.

The first lower insulating pattern 61 and the second lower insulating pattern 62 may be in contact with the separation insulating layer 20. The separation insulating layer 20 may be provided between the first lower insulating pattern 61 and the second lower insulating pattern 62, which overlap with each of the active patterns AP1, AP2 and AP3 in the third direction D3. The first lower insulating pattern 61 and the second lower insulating pattern 62, which overlap with each of the active patterns AP1, AP2 and AP3 in the third direction D3, may be spaced apart from each other in the first direction D1 by the separation insulating layer 20.

In various embodiments, the second lower insulating pattern 62 may include first portions 62_1 and second portions 62_2. The first portion 62_1 of the second lower insulating pattern 62 may overlap with the second source/drain pattern SD2 in the third direction D3. The second portion 62_2 of the second lower insulating pattern 62 may overlap with the second channel pattern CH2 in the third direction D3. The first portions 62_1 and the second portions 62_2 of the second lower insulating pattern 62 may be alternately arranged in the second direction D2.

A plurality of the first source/drain patterns SD1 and a plurality of the second source/drain patterns SD2 may be in contact with the separation insulating layer 20. The separation insulating layer 20 may be provided between the first source/drain patterns SD1 and the second source/drain patterns SD2, which overlap with each of the active patterns AP1, AP2 and AP3 in the third direction D3. The first source/drain patterns SD1 and the second source/drain patterns SD2, which overlap with each of the active patterns AP1, AP2 and AP3 in the third direction D3, may be spaced apart from each other in the first direction D1 by the separation insulating layer 20.

In various embodiments, a cover insulating layer 50 may be provided, where the cover insulating layer 50 may be formed on the device isolation layer 11, the active patterns AP1, AP2 and AP3, first lower insulating pattern 61, the second lower insulating pattern 62, first source/drain pattern SD1, and second source/drain pattern SD2. The cover insulating layer 50 may be in direct contact with the first source/drain pattern SD1, the second source/drain pattern SD2, the first lower insulating pattern 61, the second lower insulating pattern 62, the active patterns AP1, AP2 and AP3, a gate spacer GS, a gate capping pattern GP, and the device isolation layer 11. The cover insulating layer 50 may include an insulating material, where for example, the cover insulating layer 50 may include silicon nitride.

In various embodiments, the cover insulating layer 50 may include a first portion 51, a second portion 52, a third portion 53, and a fourth portion 54. The first portion 51 of the cover insulating layer 50 may be in contact with a sidewall of the first source/drain pattern SD1 or the second source/drain pattern SD2. The second portion 52 of the cover insulating layer 50 may be between the first source/drain pattern SD1 and the first portion 61_1 of the first lower insulating pattern 61 and/or between the second source/drain pattern SD2 and the first portion 62_1 of the second lower insulating pattern 62. The third portion 53 of the cover insulating layer 50 may be in contact with a sidewall of the first portion 61_1 of the first lower insulating pattern 61 or a sidewall of the first portion 62_1 of the second lower insulating pattern 62. The fourth portion 54 of the cover insulating layer 50 may be in contact with the device isolation layer 11.

A first insulating layer 12 may be provided on the cover insulating layer 50. The first insulating layer 12 may be laterally adjacent to the sidewalls of the first source/drain pattern SD1 and the second source/drain pattern SD2, where the first insulating layer 12 may be separated from the first source/drain pattern SD1 and the second source/drain pattern SD2 by the cover insulating layer 50. The first insulating layer 12 may include an insulating material, where for example, the first insulating layer 12 may include an oxide.

In various embodiments, first active contacts 41 may be provided. The first active contact 41 may be provided on the first source/drain pattern SD1. The first active contact 41 may include a first bottom surface 41_B1 and a second bottom surface 41_B2, where the second bottom surface 41_B2 may be closer to the active patterns AP1, AP2 and AP3 than the first bottom surface 41_B1. The first bottom surface 41_B1 of the first active contact 41 may be in contact with the first source/drain pattern SD1. The second bottom surface 41_B2 of the first active contact 41 may be in contact with the first source/drain pattern SD1 and the cover insulating layer 50. A level of the first bottom surface 41_B1 of the first active contact 41 may be higher than a level of the second bottom surface 41_B2 of the first active contact 41, where there can be a step between the second bottom surface 41_B2 and the first bottom surface 41_B1.

In various embodiments, a second active contacts 42 may be provided. The second active contact 42 may be provided on the second source/drain pattern SD2. The second active contact 42 may include a first bottom surface 42_B1 and a second bottom surface 42_B2, where the second bottom surface 42_B2 may be closer to the active patterns AP1, AP2 and AP3 than the first bottom surface 42_B1. The first bottom surface 42_B1 of the second active contact 42 may be in contact with the second source/drain pattern SD2. The second bottom surface 42_B2 of the second active contact 42 may be in contact with the second source/drain pattern SD2 and the cover insulating layer 50. A level of the first bottom surface 42_B1 of the second active contact 42 may be higher than a level of the second bottom surface 42_B2 of the second active contact 42, where there can be a step between the second bottom surface 42_B2 and the first bottom surface 42_B1.

A plurality of the first active contacts 41 and a plurality of the second active contacts 42 may be in contact with the separation insulating layer 20. The separation insulating layer 20 may be between the first active contacts 41 and the second active contacts 42, which overlap with each of the active patterns AP1, AP2 and AP3 in the third direction D3. The first active contacts 41 and the second active contacts 42, which overlap with each of the active patterns AP1, AP2 and AP3 in the third direction D3, may be spaced apart from each other in the first direction D1 by the separation insulating layer 20.

In various embodiments, the level of the top surface 20_T of the separation insulating layer 20 may be substantially the same as a level of a top surface 41_T of the first active contact 41 and a level of a top surface 42_T of the second active contact 42. The top surface 20_T of the separation insulating layer 20 may be coplanar with a top surface 41_T of the first active contact 41 and a top surface 42_T of the second active contact 42.

In various embodiments, a second insulating layer 13 may be formed on the first insulating layer 12, the first active contacts 41, the second active contacts 42, and the separation insulating layers 20. The second insulating layer 13 may have a coplanar interface with the first insulating layer 12, the first active contacts 41, the second active contacts 42, and the separation insulating layers 20, where the top surfaces of the first insulating layer 12, the first active contacts 41, the second active contacts 42, and the separation insulating layers 20 are coplanar. The second insulating layer 13 may include an electrically insulating material.

In various embodiments, connection contacts 43 may extend through the second insulating layer 13 to form an electrical contact. The connection contact 43 may be in electrical contact with the first active contact 41 or the second active contact 42. The connection contact 43 may include a conductive material.

Referring to FIG. 1C, first channel patterns CH1 and second channel patterns CH2 may overlap with each of the active patterns AP1, AP2 and AP3 in the third direction D3. The first channel patterns CH1 overlapping with each of the active patterns AP1, AP2 and AP3 in the third direction D3 may be arranged in the second direction D2. The second channel patterns CH2 overlapping with each of the active patterns AP1, AP2 and AP3 in the third direction D3 may be arranged in the second direction D2. The first channel pattern CH1 and the second channel pattern CH2 overlapping with each of the active patterns AP1, AP2 and AP3 in the third direction D3 may be spaced apart from each other in the first direction D1. The first channel pattern CH1 may be between first source/drain patterns SD1, and the second channel pattern CH2 may be between second source/drain pattern SD2.

In various embodiments, each of the first and second channel patterns CH1 and CH2 may include a first semiconductor pattern 71, a second semiconductor pattern 72, a third semiconductor pattern 73 and a fourth semiconductor pattern 74, which are sequentially arranged in the third direction D3. The first to fourth semiconductor patterns 71, 72, 73 and 74 of each of the first and second channel patterns CH1 and CH2 may be spaced apart from each other in the third direction D3. The first to fourth semiconductor patterns 71, 72, 73 and 74 of each of the first and second channel patterns CH1 and CH2 may overlap with each other in the third direction D3, where the first to fourth semiconductor patterns 71, 72, 73 and 74 may be vertically aligned. Although FIG. 1C illustrates the number of the semiconductor patterns 71, 72, 73 and 74 included in each of the first and second channel patterns CH1 and CH2 as four (4), the scope of the claims and embodiments are not intended to be limited thereto, and number of the semiconductor patterns may be one to three or may be five or more.

In various embodiments, the first to fourth semiconductor patterns 71, 72, 73 and 74 of each of the first and second channel patterns CH1 and CH2 may include silicon (Si). For example, each of the first to fourth semiconductor patterns 71, 72, 73 and 74 of each of the first and second channel patterns CH1 and CH2 may include crystalline silicon. In various embodiments, the first to fourth semiconductor patterns 71, 72, 73 and 74 of each of the first and second channel patterns CH1 and CH2 may include silicon-germanium (SiGe).

In various embodiments, the first lower insulating pattern 61 may be between each of the active patterns AP1, AP2 and AP3 and the first channel patterns CH1. The second lower insulating pattern 62 may be between each of the active patterns AP1, AP2 and AP3 and the second channel patterns CH2.

A plurality of first source/drain patterns SD1 and a plurality of second source/drain patterns SD2 may overlap with each of the active patterns AP1, AP2 and AP3 in the third direction D3. The first source/drain pattern SD1 may be disposed between the first channel patterns CH1. The second source/drain pattern SD2 may be disposed between the second channel patterns CH2. The first source/drain pattern SD1 may be disposed between two first channel patterns CH1 adjacent to each other in the second direction D2. The second source/drain pattern SD2 may be disposed between two second channel patterns CH2 adjacent to each other in the second direction D2.

The first to fourth semiconductor patterns 71, 72, 73 and 74 of the first channel pattern CH1 may be electrically connected to the first source/drain patterns SD1, where the first to fourth semiconductor patterns 71, 72, 73 and 74 of the first channel pattern CH1 may be in direct physical contact with the first source/drain patterns SD1. The first to fourth semiconductor patterns 71, 72, 73 and 74 of the second channel pattern CH2 may be electrically connected to the second source/drain patterns SD2, where the first to fourth semiconductor patterns 71, 72, 73 and 74 of the second channel pattern CH2 may be in direct physical contact with the second source/drain patterns SD2. The first channel pattern CH1 may be on a side of the separation insulating layer 20 opposite the second channel pattern CH2.

In various embodiments, first gate electrodes GE1 and second gate electrodes GE2 may be provided. The first gate electrode GE1 may intersect the first channel pattern CH1. The first gate electrode GE1 may overlap with the first channel pattern CH1 in the third direction D3, where the first gate electrode GE1 may cover the first to fourth semiconductor patterns 71, 72, 73 and 74. The second gate electrode GE2 may intersect the second channel pattern CH2. The second gate electrode GE2 may overlap with the second channel pattern CH2 in the third direction D3, where the second gate electrode GE2 may cover the first to fourth semiconductor patterns 71, 72, 73 and 74. A plurality of the first gate electrodes GE1 and a plurality of the second gate electrodes GE2 may overlap with each of the active patterns AP1, AP2 and AP3 in the third direction D3.

The first gate electrode GE1 may be disposed between the first source/drain patterns SD1 adjacent to each other in the second direction D2. The second gate electrode GE2 may be disposed between the second source/drain patterns SD2 adjacent to each other in the second direction D2. The first gate electrodes GE1 overlapping with each of the active patterns AP1, AP2 and AP3 in the third direction D3 may be arranged in the second direction D2. The second gate electrodes GE2 overlapping with each of the active patterns AP1, AP2 and AP3 in the third direction D3 may be arranged in the second direction D2.

Dummy insulating patterns 75 may be provided. A plurality of the dummy insulating patterns 75 may be provided on the first lower insulating pattern 61. A plurality of the dummy insulating patterns 75 may be provided on the second lower insulating pattern 62. The dummy insulating pattern 75 may be provided between the first channel pattern CH1 and the second portion 61_2 of the first lower insulating pattern 61. The dummy insulating pattern 75 may be provided between the second channel pattern CH2 and the second portion 62_2 of the second lower insulating pattern 62. The separation insulating layer 20 may extend through the dummy insulating patterns 75 and between the first and second lower insulating patterns 61, 62. The dummy insulating pattern 75 may include an insulating material, where for example, the dummy insulating pattern 75 may include silicon oxide or silicon carbo-oxynitride.

In various embodiments, the first gate electrode GE1 may include first interposed portions GE1_1 and a first plug portion GE1_2. The first interposed portions GE1_1 may be disposed between adjacent pairs of the first to fourth semiconductor patterns 71, 72, 73 and 74 of the first channel pattern CH1 and between the first semiconductor pattern 71 and the dummy insulating pattern 75. The first plug portion GE1_2 may be physically and electrically connected to the first interposed portions GE1_1, where the first plug portion GE1_2 and the first interposed portions GE1_1 can be uninterrupted.

The second gate electrode GE2 may include second interposed portions GE2_1 and a second plug portion GE2_2. The second interposed portions GE2_1 may be disposed between adjacent pairs of the first to fourth semiconductor patterns 71, 72, 73 and 74 of the second channel pattern CH2 and between the first semiconductor pattern 71 and the dummy insulating pattern 75. The second plug portion GE2_2 may be physically and electrically connected to the second interposed portions GE2_1, where the second plug portion GE2_2 and the second interposed portions GE2_1 can be uninterrupted.

In various embodiments, the first plug portion GE1_2 and the second plug portion GE2_2 may include a conductive material different from that of the first interposed portion GE1_1 and the second interposed portion GE2_1. The conductive material of the first interposed portion GE1_1 and the second interposed portion GE2_1 may be determined based on the conductivity type of the first source/drain pattern SD1 and the second source/drain pattern SD2.

In various embodiments, the first interposed portions GE1_1 overlapping with the first active pattern AP1 in the third direction D3, the second interposed portions GE2_1 overlapping with the second active pattern AP2 in the third direction D3, and the first interposed portions GE1_1 overlapping with the third active pattern AP3 in the third direction D3 may include a first conductive material, and the second interposed portions GE2_1 overlapping with the first active pattern AP1 in the third direction D3, the first interposed portions GE1_1 overlapping with the second active pattern AP2 in the third direction D3, and the second interposed portions GE2_1 overlapping with the third active pattern AP3 in the third direction D3 may include a second conductive material different from the first conductive material.

In various embodiments, the first and second interposed portions GE1_1 and GE2_1 overlapping with the first active pattern AP1 in the third direction D3 and the first and second interposed portions GE1_1 and GE2_1 overlapping with the third active pattern AP3 in the third direction D3 may include the first conductive material, and the first and second interposed portions GE1_1 and GE2_1 overlapping with the second active pattern AP2 in the third direction D3 may include the second conductive material different from the first conductive material.

In various embodiments, the first gate electrode GE1, the first to fourth semiconductor patterns 71, 72, 73 and 74 of the first channel pattern CH1, the second gate electrode GE2 and the first to fourth semiconductor patterns 71, 72, 73 and 74 of the second channel pattern CH2 may constitute a three-dimensional field effect transistor (e.g., a MBCFET or a GAAFET).

Gate insulating layers GI may be provided, where the gate insulating layer GI may separate and electrically insulate the first gate electrode GE1 from the first channel pattern CH1. The gate insulating layer GI may separate and electrically insulate the second gate electrode GE2 from the second channel pattern CH2. The gate insulating layer GI may cover the device isolation layer 11. The gate insulating layer GI may include an insulating material, where for example, the gate insulating layer GI may include an oxide.

Gate capping patterns GP may be provided, where the gate capping pattern GP may be provided on each of the first plug portion GE1_2 of the first gate electrode GE1 and the second plug portion GE2_2 of the second gate electrode GE2. The gate capping pattern GP may include an insulating material. The second insulating layer 13 may be on the gate capping pattern GP, where the gate capping pattern GP can separate the first plug portion GE1_2 of the first gate electrode GE1 and the second plug portion GE2_2 of the second gate electrode GE2 from the second insulating layer 13.

A plurality of the first channel patterns CH1 and a plurality of the second channel patterns CH2 may be in contact with the separation insulating layer 20. The separation insulating layer 20 may be provided between the first channel patterns CH1 and the second channel patterns CH2, which overlap with each of the active patterns AP1, AP2 and AP3 in the third direction D3. The first channel patterns CH1 and the second channel patterns CH2, which overlap with each of the active patterns AP1, AP2 and AP3 in the third direction D3, may be spaced apart from each other in the first direction D1 by the separation insulating layer 20.

The separation insulating layer 20 may be provided between the first gate electrodes GE1 and the second gate electrodes GE2, which overlap with each of the active patterns AP1, AP2 and AP3 in the third direction D3. The first gate electrodes GE1 and the second gate electrodes GE2, which overlap with each of the active patterns AP1, AP2 and AP3 in the third direction D3, may be spaced apart from each other in the first direction D1 by the separation insulating layer 20.

The separation insulating layer 20 may be provided between portions of the gate capping patterns GP, where the gate capping patterns GP and the separation insulating layer 20 may be adjacent to each other in the first direction D1. The separation insulating layer 20 may extend through the gate capping patterns GP to the second insulating layer 13.

A level of a top surface 20_T of the separation insulating layer 20 may be higher than a level of a top surface GE1_T of the first gate electrode GE1 and a level of a top surface GE2_T of the second gate electrode GE2. The level of the top surface 20_T of the separation insulating layer 20 may be substantially the same as a level of a top surface GP_T of the gate capping pattern GP. The top surface 20_T of the separation insulating layer 20, the top surface GP_T of the gate capping pattern GP, the top surface 41_T of the first active contact 41 and the top surface 42_T of the second active contact 42 may be substantially coplanar with each other.

In various embodiments, gate separation patterns 30 may be provided. A plurality of the gate separation patterns 30 may be disposed between adjacent pairs of the separation insulating layers 20, where the gate separation patterns 30 and separation insulating layers 20 can be adjacent to each other in the first direction D1. The gate separation patterns 30 may be disposed between the active patterns AP1, AP2 and AP3. For example, the gate separation pattern 30 may be disposed between the first and second active patterns AP1 and AP2. The gate separation pattern 30 may be provided on the device isolation layer 11, where the gate separation pattern 30 may extend into the device isolation layer 11. A bottom surface 30_B of the gate separation pattern 30 may be provided in the device isolation layer 11. The gate separation pattern 30 may extend in the third direction D3. The gate separation pattern 30 may include an insulating material, where for example, the gate separation pattern 30 may include silicon nitride.

In various embodiments, the gate separation pattern 30 may be provided between the first gate electrode GE1 overlapping with the first active pattern AP1 in the third direction D3 and the second gate electrode GE2 overlapping with the second active pattern AP2 in the third direction D3. The gate separation pattern 30 may separate the first gate electrode GE1 from the second gate electrode GE2 in the first direction D1.

In various embodiments, the first plug portion GE1_2 of the first gate electrode GE1 overlapping with the first active pattern AP1 in the third direction D3 and the second plug portion GE2_2 of the second gate electrode GE2 overlapping with the second active pattern AP2 in the third direction D3 may be in contact with sidewalls 30_S of the gate separation pattern 30.

In various embodiments, a width of the gate separation pattern 30 in the second direction D2 may be less than a width of the separation insulating layer 20 in the second direction D2. The width of the gate separation pattern 30 in the second direction D2 may be greater than a width of the first gate electrode GE1 in the second direction D2 and a width of the second gate electrode GE2 in the second direction D2, where the gate separation pattern 30 can extend past each end of the first gate electrode GE1 and the second gate electrode GE2.

The gate separation pattern 30 may be provided between the gate capping patterns GP adjacent to each other in the first direction D1.

In various embodiments, a level of a top surface 30_T of the gate separation pattern 30 may be higher than the level of the top surface GE1_T of the first gate electrode GE1 and the level of the top surface GE2_T of the second gate electrode GE2 adjoining the gate separation pattern 30. The level of the top surface 30_T of the gate separation pattern 30 may be substantially the same as the level of the top surface GP_T of the gate capping pattern GP, where the top surface GP_T of the gate capping pattern GP and the top surface 30_T of the gate separation pattern 30 may be coplanar. The level of the top surface 30_T of the gate separation pattern 30 may be substantially the same as the level of the top surface 41_T of the first active contact 41 and the level of the top surface 42_T of the second active contact 42. The level of the top surface 30_T of the gate separation pattern 30 may be substantially the same as the level of the top surface 20_T of the separation insulating layer 20, where the top surface 30_T of the gate separation pattern 30 may be coplanar with the top surface 20_T of the separation insulating layer 20.

In various embodiments, a first gate contact 44 may be provided, where the first gate contact 44 may be provided on a separation insulating layer 20. The first gate contact 44 may have a lower portion between a first gate electrode GE1 and a second gate electrode GE2, and an upper portion between gate capping patterns GP. The first gate contact 44 may be provided between the gate capping patterns GP adjacent to each other in the first direction D1. The first gate contact 44 may be in contact with an upper portion of the first plug portion GE1_2 of the first gate electrode GE1 and an upper portion of the second plug portion GE2_2 of the second gate electrode GE2. A top surface of the first gate contact 44 may be located at the same level as the top surface 20_T of the separation insulating layer 20 and the top surface 30_T of the gate separation pattern 30. The first gate contact 44 may include a conductive material.

A second insulating layer 13 may be provided on the first insulating layer 12, the gate capping patterns GP, the first gate contact 44, the separation insulating layers 20, and the gate separation patterns 30. The second insulating layer 13 may include an insulating material.

Second gate contacts 45 may extend through the second insulating layer 13 in the third direction D3. The second gate contact 45 may penetrate the gate capping pattern GP. The second gate contact 45 may be in electrical contact with the first gate electrode GEL or the second gate electrode GE2. The second gate contact 45 may include a conductive material.

Referring to FIG. 1D, gate spacers GS may be provided, where the gate spacers GS may be disposed on both sidewalls of an upper portion of the first plug portion GE1_2 of the first gate electrode GE1. The gate spacers GS may be disposed on both sidewalls of an upper portion of the second plug portion GE2_2 of the second gate electrode GE2. The gate spacers GS may be between the cover insulating layer 50 and the first plug portion GE1_2 of the first gate electrode GE1, and between the cover insulating layer 50 and the second plug portion GE2_2 of the second gate electrode GE2. The gate capping pattern GP may be on an upper end of the gate spacers GS. The gate spacers GS may include an insulating material.

In various embodiments, connection contacts 43 may extend through the second insulating layer 13 to the first active contact 41, where the connection contacts 43 can be electrically connected to a first source/drain pattern SD1 through the first active contact 41.

In various embodiments, a gate insulating layer GI may be on the first plug portion GE1_2 and first interposed portions GE1_1. The gate capping pattern GP may be over the gate spacers GS, gate insulating layer GI, and first plug portion GE1_2.

In various embodiments, a fourth portion 54 of the cover insulating layer 50 may be between the first source/drain pattern SD1 and the first portion 61_1 of the first lower insulating pattern 61.

Referring to FIG. 1E, the second insulating layer 13 may be over the separation insulating layer 20 and a first gate contact 44 in the separation insulating layer 20. The top surface 20_T of the separation insulating layer 20 can be coplanar with a top surface of the first gate contact 44. The first gate contact 44 can overlap the second active pattern AP2.

Referring to FIG. 1F, the cover insulating layer 50 may include a first portion 51, a second portion 52, a third portion 53, and a fourth portion 54. The first portion 51 of the cover insulating layer 50 may be in contact with a sidewall of the first source/drain pattern SD1 and/or the second source/drain pattern SD2. The second portion 52 of the cover insulating layer 50 may be disposed between the first source/drain pattern SD1 and the first portion 61_1 of the first lower insulating pattern 61 or between the second source/drain pattern SD2 and the first portion 62_1 of the second lower insulating pattern 62. The third portion 53 of the cover insulating layer 50 may be in contact with a sidewall of the first portion 61_1 of the first lower insulating pattern 61 or a sidewall of the first portion 62_1 of the second lower insulating pattern 62. The fourth portion 54 of the cover insulating layer 50 may be in contact with the device isolation layer 11.

The first portion 61_1 of the first lower insulating pattern 61 may include a first curved surface 61_1C in contact with the second portion 52 of the cover insulating layer 50, where the first curved surface 61_1C may be a top surface of the first portion 61_1 of the first lower insulating pattern 61. The first curved surface 61_1C may be in contact with the sidewall 20_S of the separation insulating layer 20, where the level of the first curved surface 61_1C may become lower toward the sidewall 20_S of the separation insulating layer 20.

The first portion 62_1 of the second lower insulating pattern 62 may include a second curved surface 62_1C in contact with the second portion 52 of the cover insulating layer 50, where the second curved surface 62_1C may be a top surface of the first portion 62_1 of the second lower insulating pattern 62. The second curved surface 62_1C may be in contact with the sidewall 20_S of the separation insulating layer 20, where the level of the second curved surface 62_1C may become lower toward the sidewall 20_S of the separation insulating layer 20.

The second portion 52 of the cover insulating layer 50 may be in contact with a bottom surface of the first source/drain pattern SD1 and the first curved surface 61_1C or may be in contact with a bottom surface of the second source/drain pattern SD2 and the second curved surface 62_1C.

In various embodiments, a thickness T1, in the third direction D3, of the first portion 61_1 of the first lower insulating pattern 61 may become less toward the separation insulating layer 20. A thickness T2, in the third direction D3, of the second portion 52 of the cover insulating layer 50 may become greater toward the separation insulating layer 20. A bottom surface 20_B of the separation insulating layer 20 may be disposed in the active pattern AP1, AP2 or AP3. A level of the bottom surface 20_B of the separation insulating layer 20 may be lower than a level of a top surface of the active pattern AP1, AP2 or AP3, such that the bottom surface 20_B is below the first portion 61_1 and the second portion 62_1. A sidewall of the first portion 61_1 of the first lower insulating pattern 61 may be in contact with one of both sidewalls 20_S of the separation insulating layer 20. A sidewall of the second portion 62_1 of the second lower insulating pattern 62 may be in contact with the other of both sidewalls 20_S of the separation insulating layer 20.

In various embodiments, a width of the separation insulating layer 20 in a semiconductor device may be relatively small. Thus, a distance between the first channel pattern CH1 and the second channel pattern CH2 may be relatively small, and electrical characteristics of the semiconductor device may be improved.

In various embodiments, the level of the top surface 20_T of the separation insulating layer 20 may be substantially the same as the level of the top surfaces 41_T and 42_T of the active contacts 41 and 42, and thus the active contacts 41 and 42 may be physically and electrically separated from each other by the separation insulating layer 20 to avoid an electrical short in which the active contacts 41 and 42 may become electrically connected to each other.

FIGS. 2A, 2B, 2C, 3A, 3B, 3C, 4A, 4B, 4C, 5A, 5B, 5C, 5D, 6A, 6B, 6C, 6D, 7A, 7B, 7C, 7D, 8, 9, 10A, 10B, 10C and 10D are cross-sectional views illustrating a method of manufacturing the semiconductor device according to FIGS. 1A to 1F.

Figure 2A:
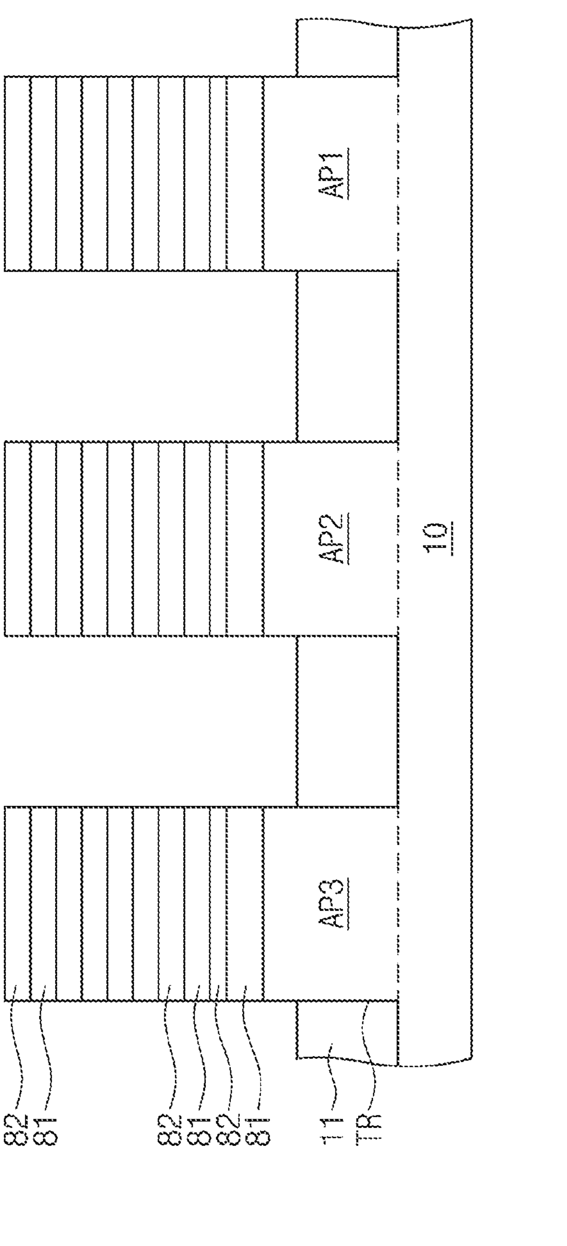

Referring to FIG. 2A, active patterns AP1, AP2 and AP3, first semiconductor layers 81 and second semiconductor layers 82 may be formed, where the first semiconductor layers 81 and second semiconductor layers 82 may be alternatingly stacked on the active patterns AP1, AP2 and AP3 in the third direction D3. The first semiconductor layers 81 may include a material having an etch selectivity with respect to the second semiconductor layers 82, where for example, the first semiconductor layers 81 may include silicon-germanium (SiGe), and the second semiconductor layers 82 may include silicon (Si). A trench TR and a device isolation layer 11 may be formed in the process of forming the active patterns AP1, AP2 and AP3, the first semiconductor layers 81 and the second semiconductor layers 82.

In various embodiments, a concentration of germanium (Ge) in lowermost ones of the first semiconductor layers 81 may be different from a concentration of germanium (Ge) in the others of the first semiconductor layers 81.

Figure 2B:
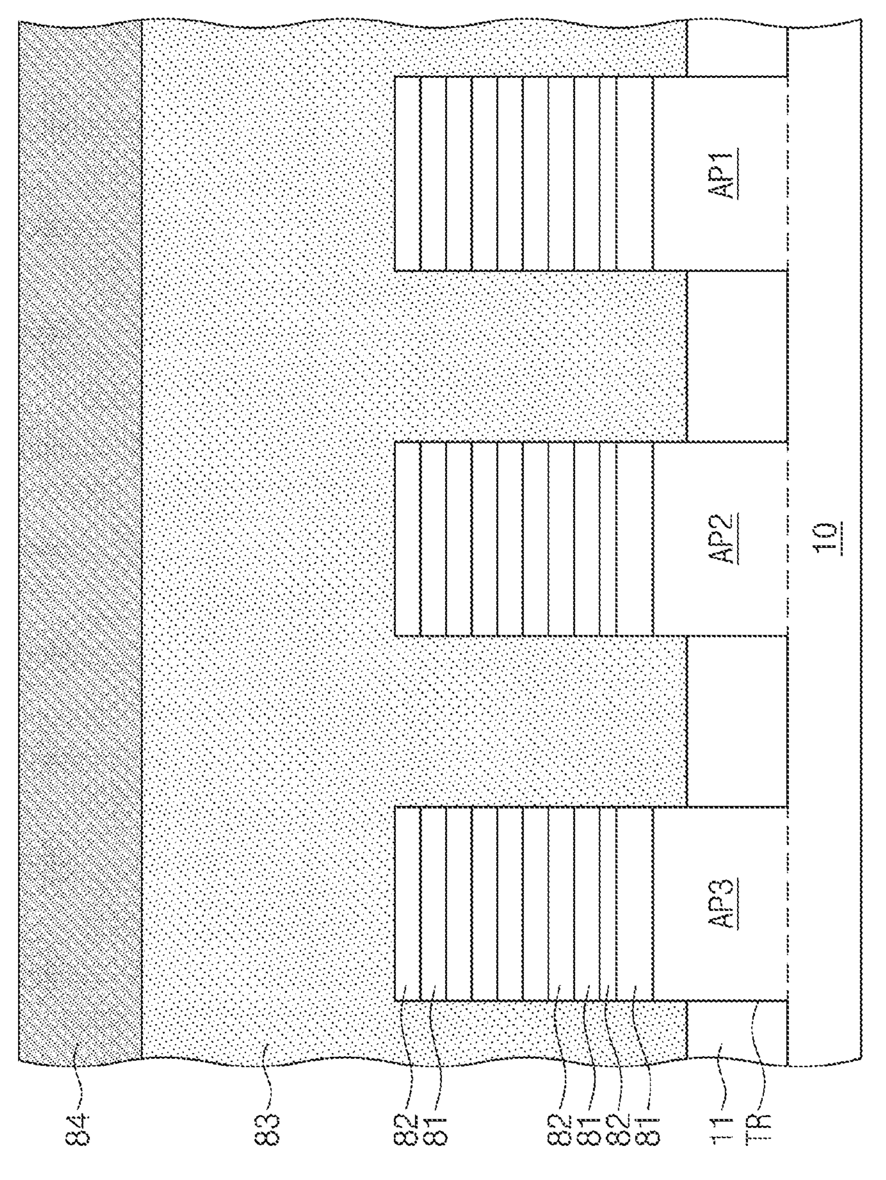

Referring to FIG. 2B, sacrificial patterns 83 and mask patterns 84 on the sacrificial patterns 83 may be formed. The sacrificial pattern 83 and the mask pattern 84 may extend in the first direction D1. The sacrificial patterns 83 may be arranged in the second direction D2. The mask patterns 84 may be arranged in the second direction D2. The sacrificial patterns 83 may be formed using an etching process using the mask patterns 84 as etch masks. The sacrificial pattern 83 may include poly-silicon. The mask pattern 84 may include an insulating material. Gate spacers GS may be formed on sidewalls of the sacrificial pattern 83 and the mask pattern 84.

Figure 2C:
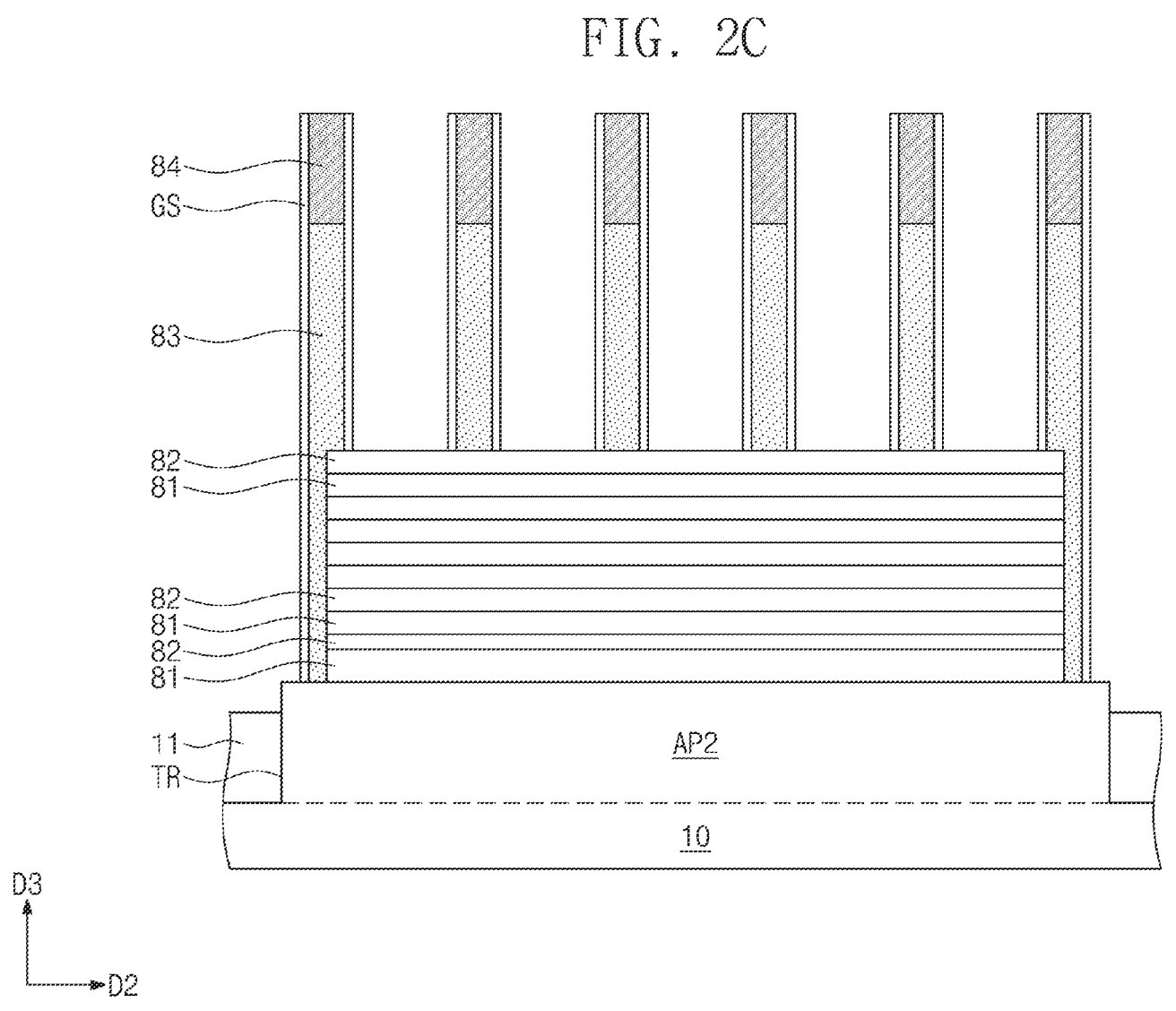

Referring to FIG. 2C, portions of the sacrificial pattern 83 and the mask pattern 84 may be removed to form separate portions of the sacrificial pattern 83 and the mask pattern 84 on the first semiconductor layers 81 and second semiconductor layers 82. A gate spacer GS may be formed on the separate portions of the sacrificial pattern 83 and the mask pattern 84.

Figure 3A:
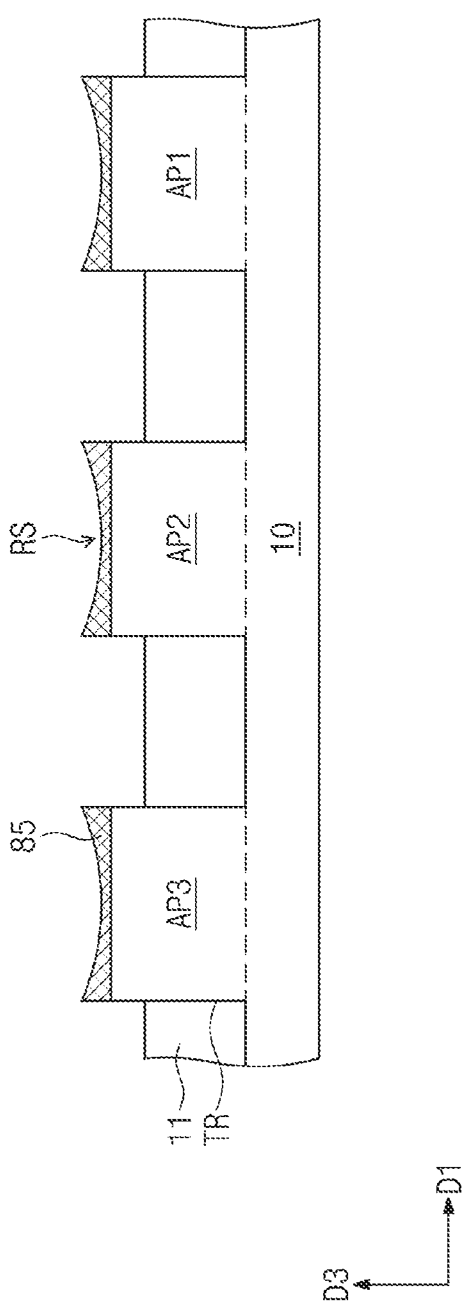
Figure 3B:
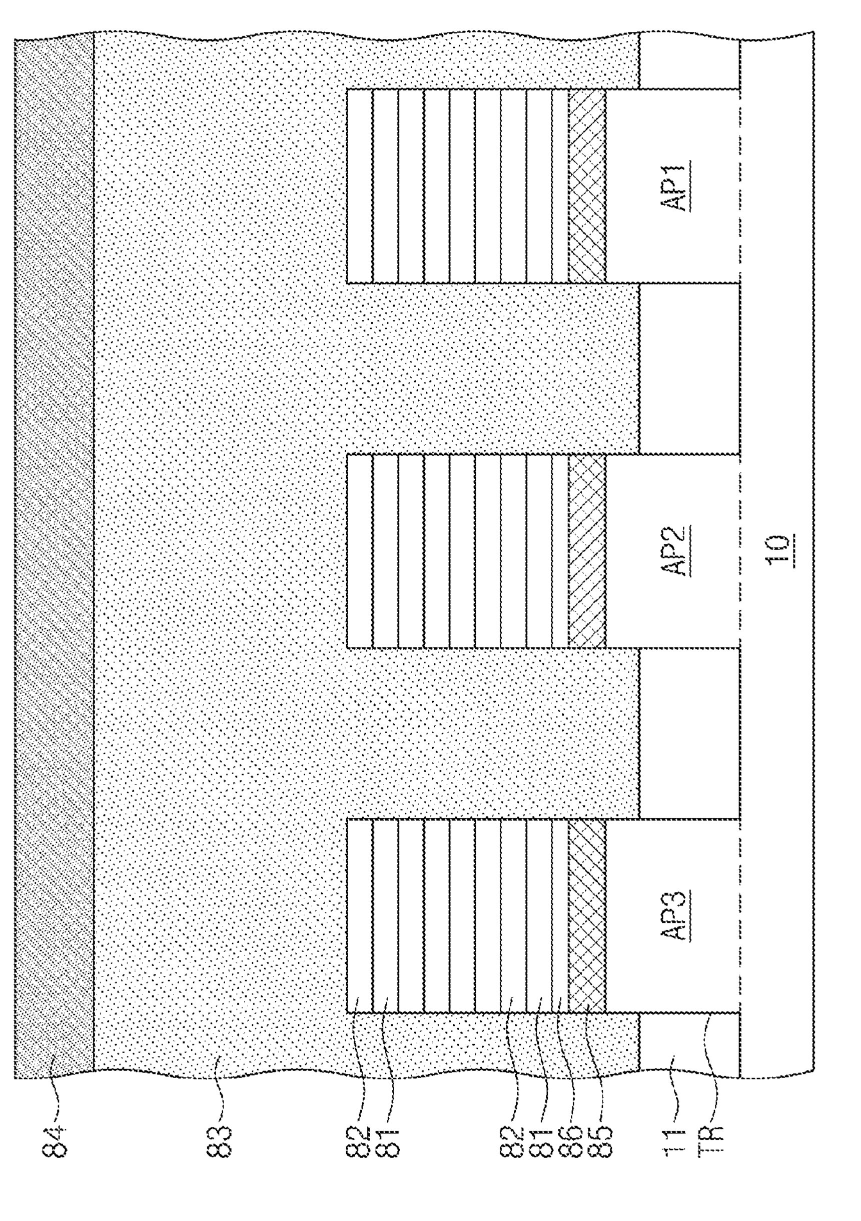
Figure 3C:
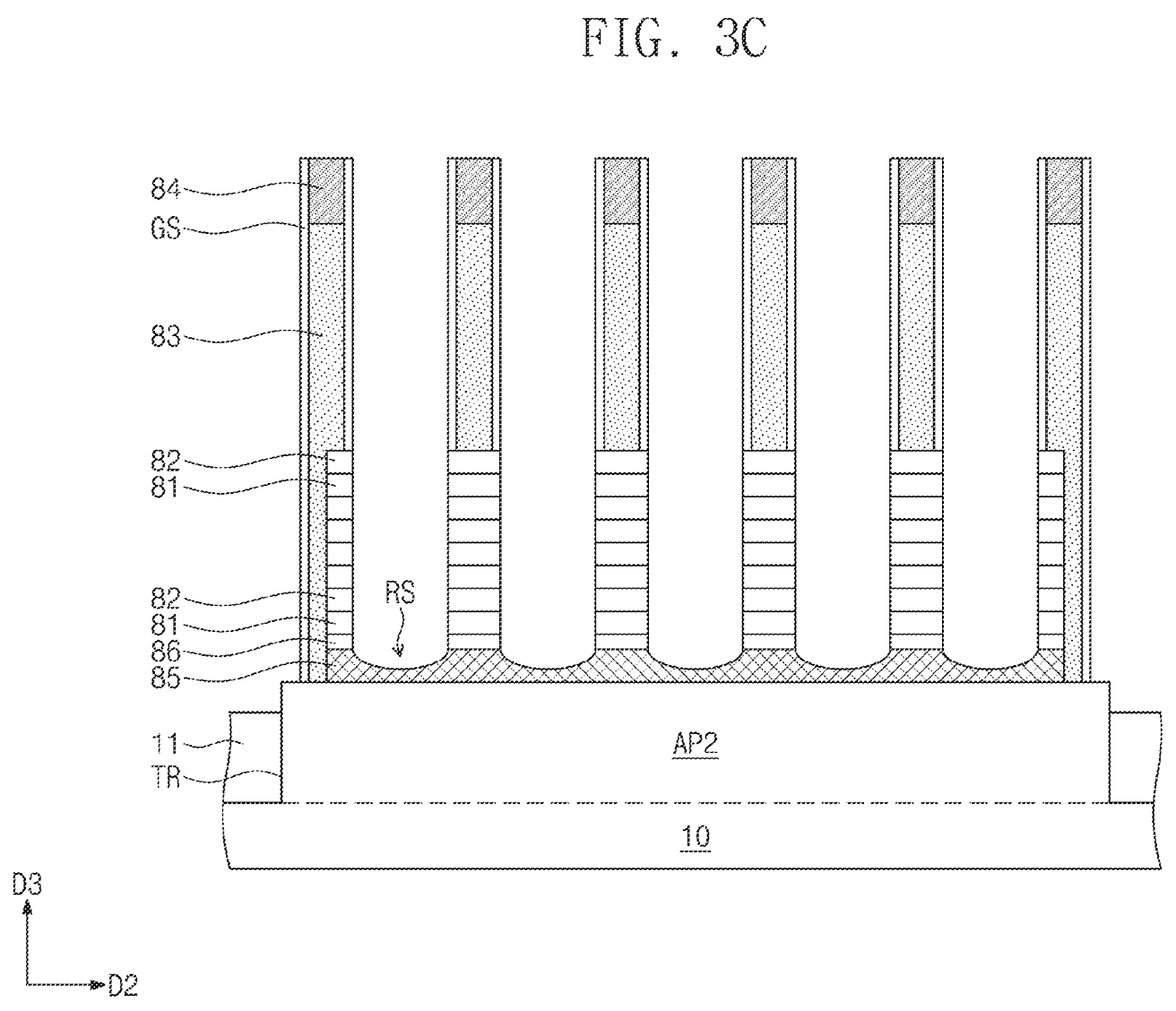

Referring to FIGS. 3A, 3B and 3C, lower insulating layers 85 and dummy insulating layers 86 may be formed on the active patterns AP1, AP2 and AP3. The lowermost ones of the first semiconductor layers 81 may be selectively removed to form empty spaces, and the lower insulating layers 85 may be formed to fill the empty spaces. The lower insulating layer 85 may include an insulating material, where for example, the lower insulating layer 85 may include a first layer including silicon carbo-oxynitride and a second layer including silicon oxide or silicon nitride, and the first layer may surround the second layer.

In the process of forming the lower insulating layers 85, lowermost ones of the second semiconductor layers 82 may be oxidized to form the dummy insulating layers 86. The dummy insulating layer 86 may include an insulating material, where for example, the dummy insulating layer 86 may include silicon oxide or silicon carbo-oxynitride.

In various embodiments, the first semiconductor layers 81, the second semiconductor layers 82, the dummy insulating layers 86 and the lower insulating layers 85 may be etched using the mask patterns 84 and the gate spacers GS as etch masks. The first semiconductor layer 81 may be etched to be divided into a plurality of first semiconductor layers 81. The second semiconductor layer 82 may be etched to be divided into a plurality of second semiconductor layers 82. The dummy insulating layer 86 may be etched to be divided into a plurality of dummy insulating layers 86. The first semiconductor layers 81, the second semiconductor layers 82, the dummy insulating layers 86 and the lower insulating layers 85 may be etched to form recesses RS, as shown in FIG. 3C.

Figure 4A:
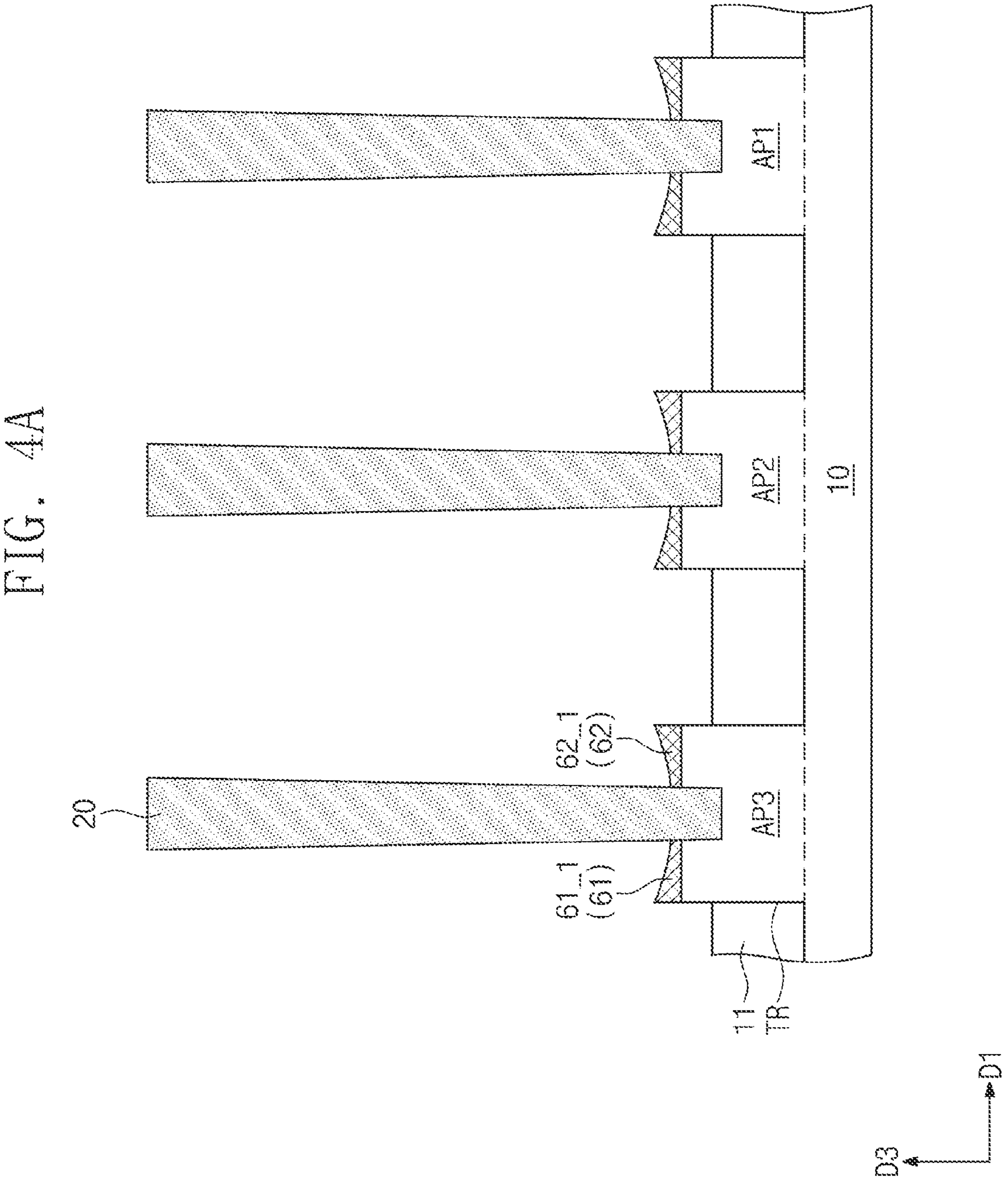
Figure 4B:
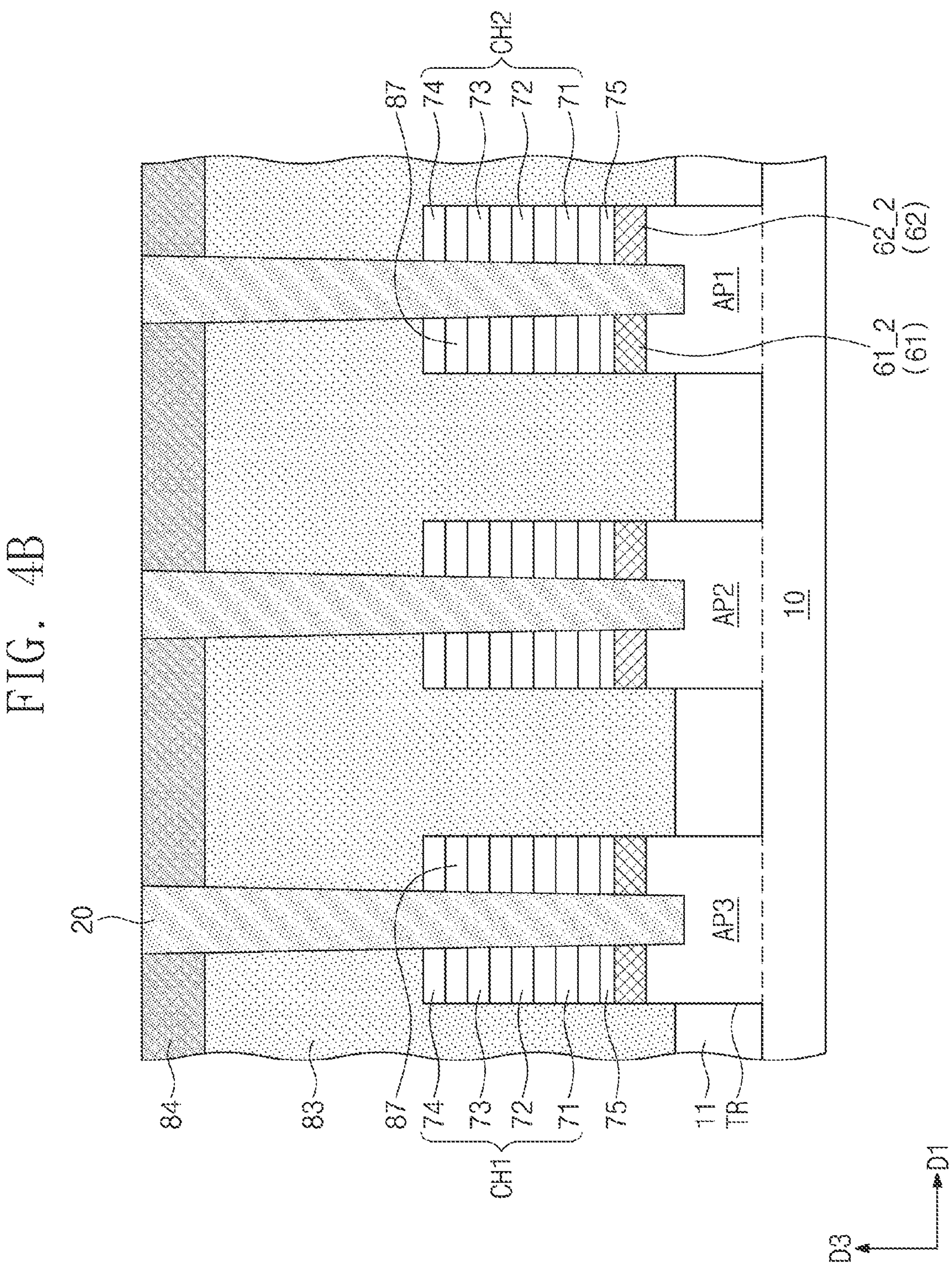
Figure 4C:
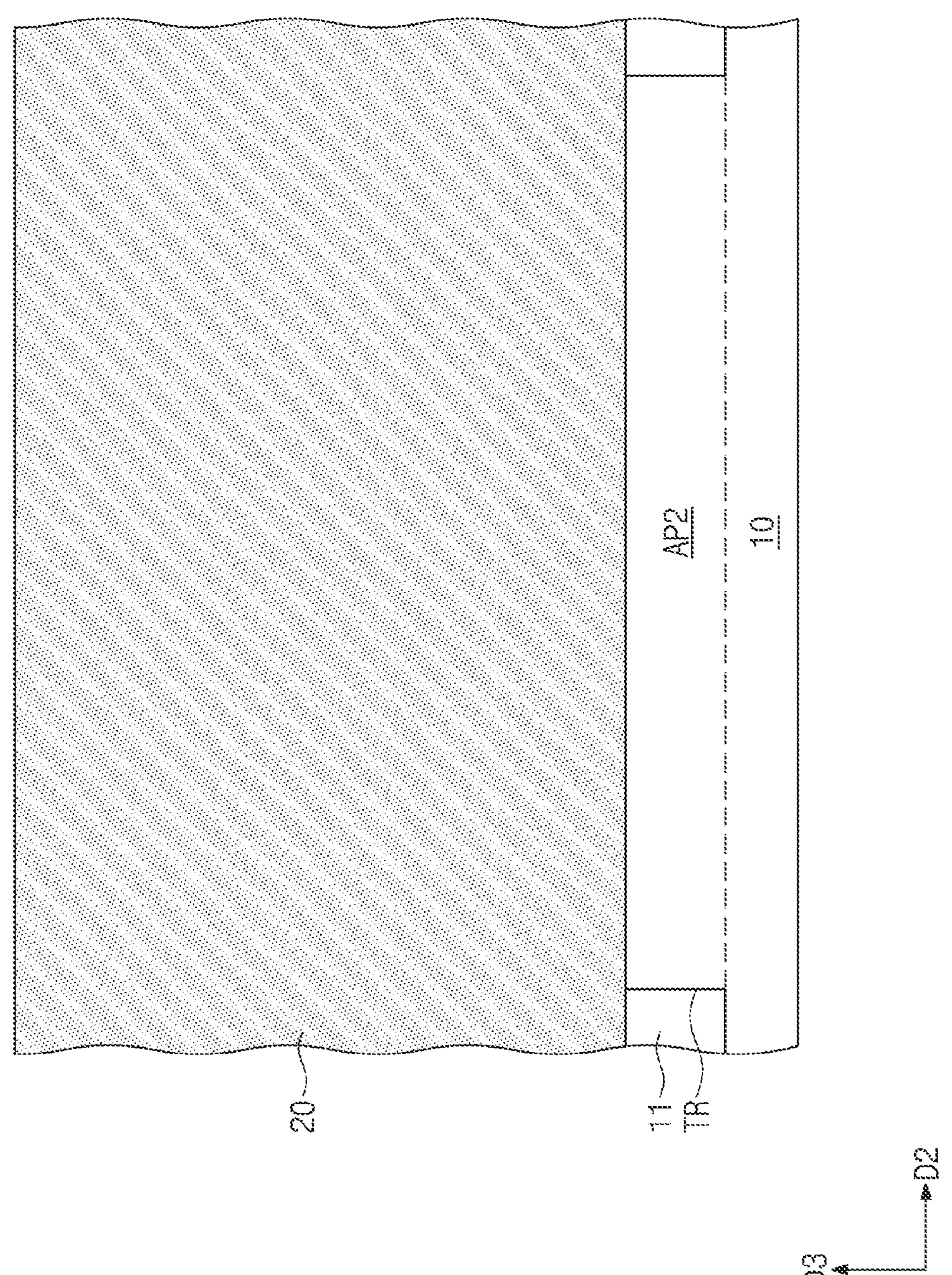
Figure 5A:
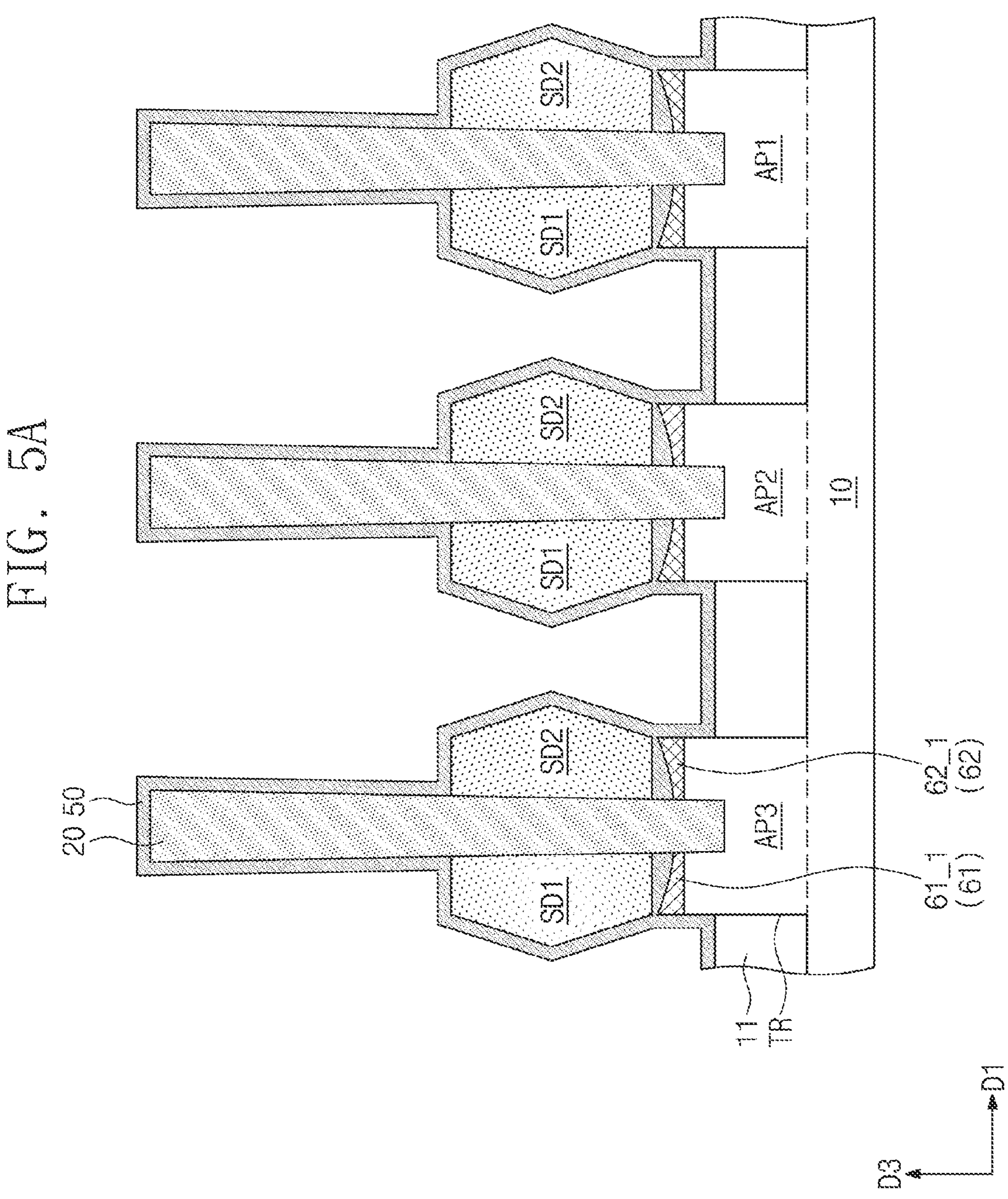
Figure 5B:
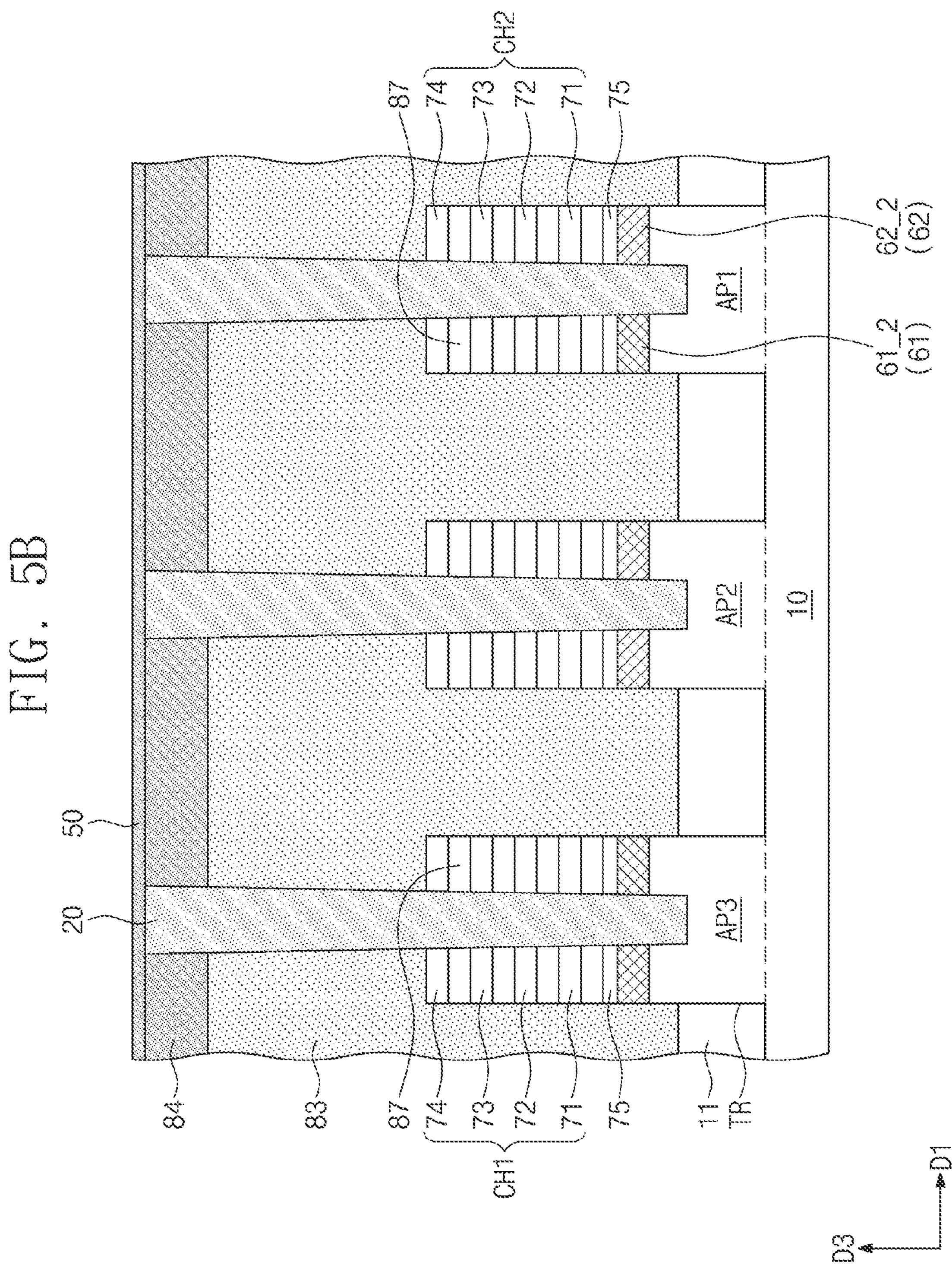
Figure 5C:
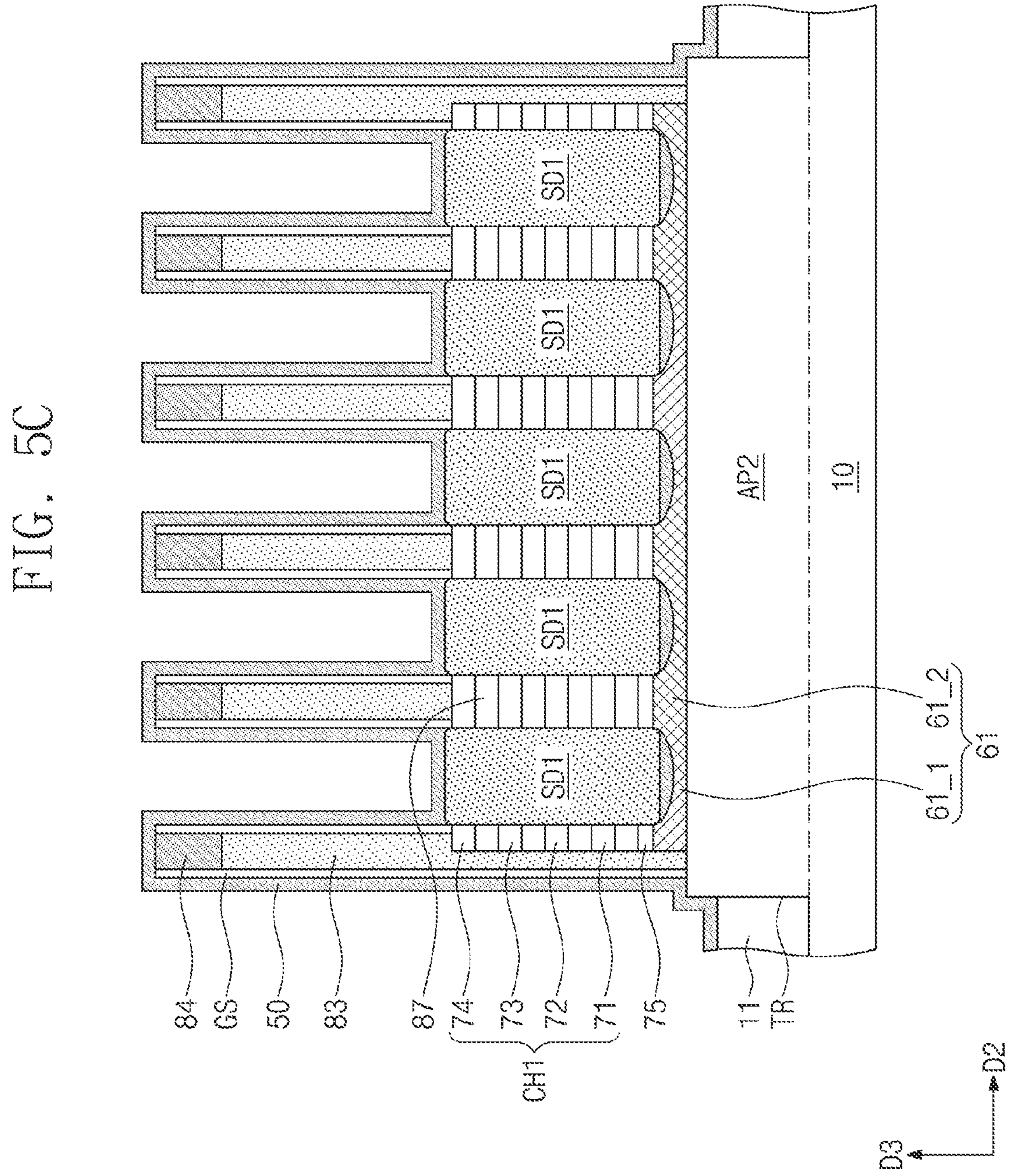
Figure 5D:
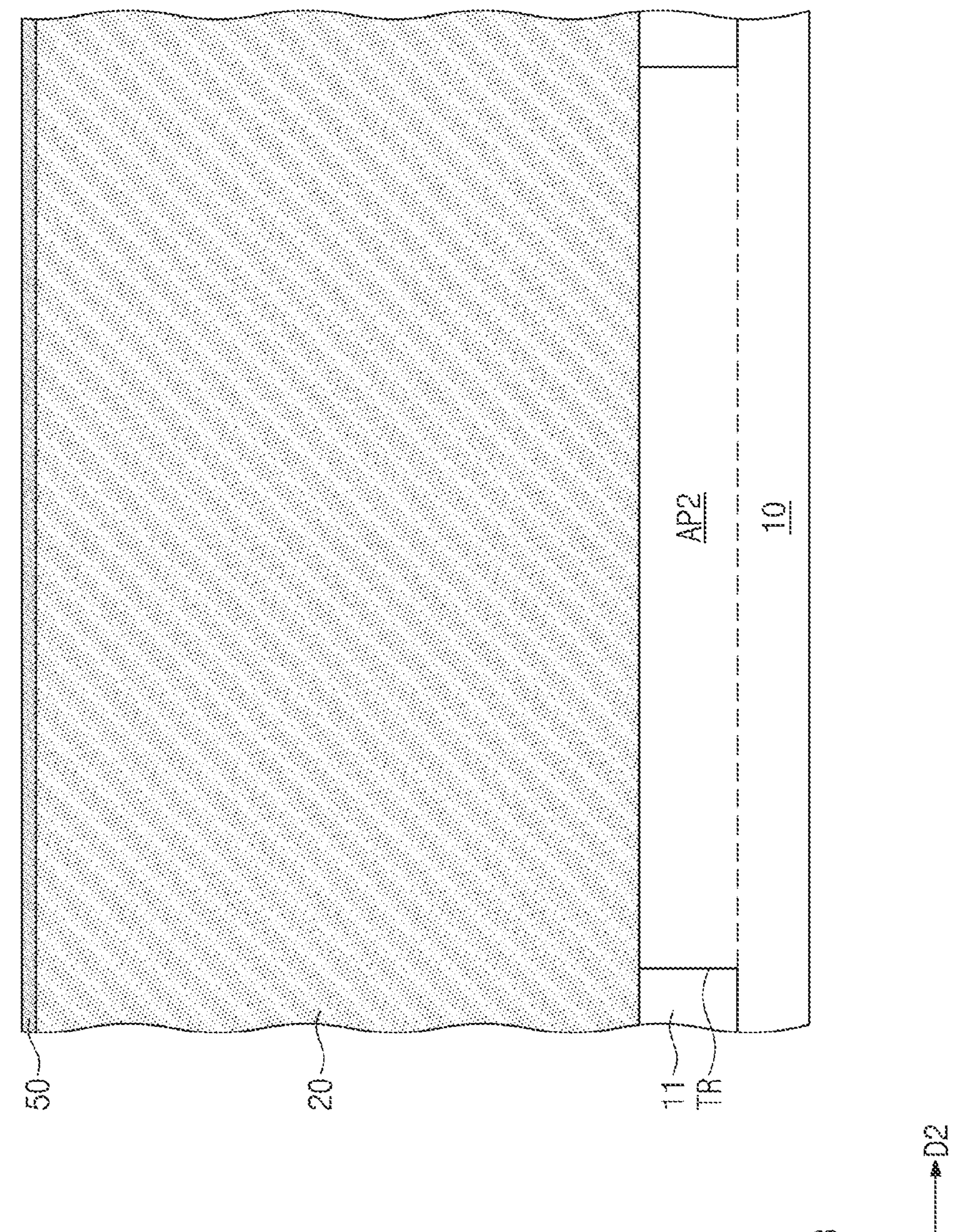

Referring to FIGS. 4A, 4B and 4C, separation insulating layers 20 may be formed. The formation of the separation insulating layers 20 may include forming a coating layer, forming the separation insulating layers 20 penetrating the coating layer, and removing the coating layer. For example, the coating layer may include silicon oxide or a spin-on-hardmask (SOH).

In various embodiments, the lower insulating layer 85 may be divided into a first lower insulating pattern 61 and a second lower insulating pattern 62 by the separation insulating layer 20. The dummy insulating layer 86 may be divided into two dummy insulating patterns 75 by the separation insulating layer 20, as shown in FIG. 4B. The stacked second semiconductor layers 82 may be divided into first to fourth semiconductor patterns 71, 72, 73 and 74 of a first channel pattern CH1 and first to fourth semiconductor patterns 71, 72, 73 and 74 of a second channel pattern CH2 by the separation insulating layer 20. The first semiconductor layer 81 may be divided into two sacrificial semiconductor patterns 87 by the separation insulating layer 20.

The separation insulating layer 20 may penetrate the sacrificial patterns 83 and the mask patterns 84.

Referring to FIGS. 5A, 5B, 5C and 5D, first source/drain patterns SD1 and second source/drain patterns SD2 may be formed. The first source/drain patterns SD1 may be formed by performing a selective epitaxial process on the first to fourth semiconductor patterns 71, 72, 73 and 74 of the first channel patterns CH1, where the first source/drain patterns SD1 may grow from the exposed surfaces of the first to fourth semiconductor patterns 71, 72, 73 and 74. The second source/drain patterns SD2 may be formed by performing a selective epitaxial process on the first to fourth semiconductor patterns 71, 72, 73 and 74 of the second channel patterns CH2, where the second source/drain patterns SD2 may grow from the exposed surfaces of the first to fourth semiconductor patterns 71, 72, 73 and 74.

In various embodiments, a cover insulating layer 50 may be formed to cover the first and second source/drain patterns SD1 and SD2, the first and second lower insulating patterns 61 and 62, the separation insulating layers 20, the mask patterns 84 and the gate spacers GS.

Referring to FIGS. 6A, 6B, 6C and 6D, a first insulating layer 12 may be formed on the separation insulating layers 20, the first and second source/drain patterns SD1 and SD2, and the device isolation layer 11. A capping insulating layer 88 may be formed on the first insulating layer 12. The capping insulating layer 88 may include an insulating material. For example, the capping insulating layer 88 may include silicon nitride.

In the process of forming the capping insulating layer 88, an upper portion of the cover insulating layer 50, an upper portion of the separation insulating layer 20 and the mask pattern 84 may be removed. For example, the upper portion of the cover insulating layer 50, the upper portion of the separation insulating layer 20 and the mask pattern 84 may be removed by a chemical mechanical polishing (CMP) process. The mask pattern 84 may be removed to expose the sacrificial pattern 83.

Figure 6A:
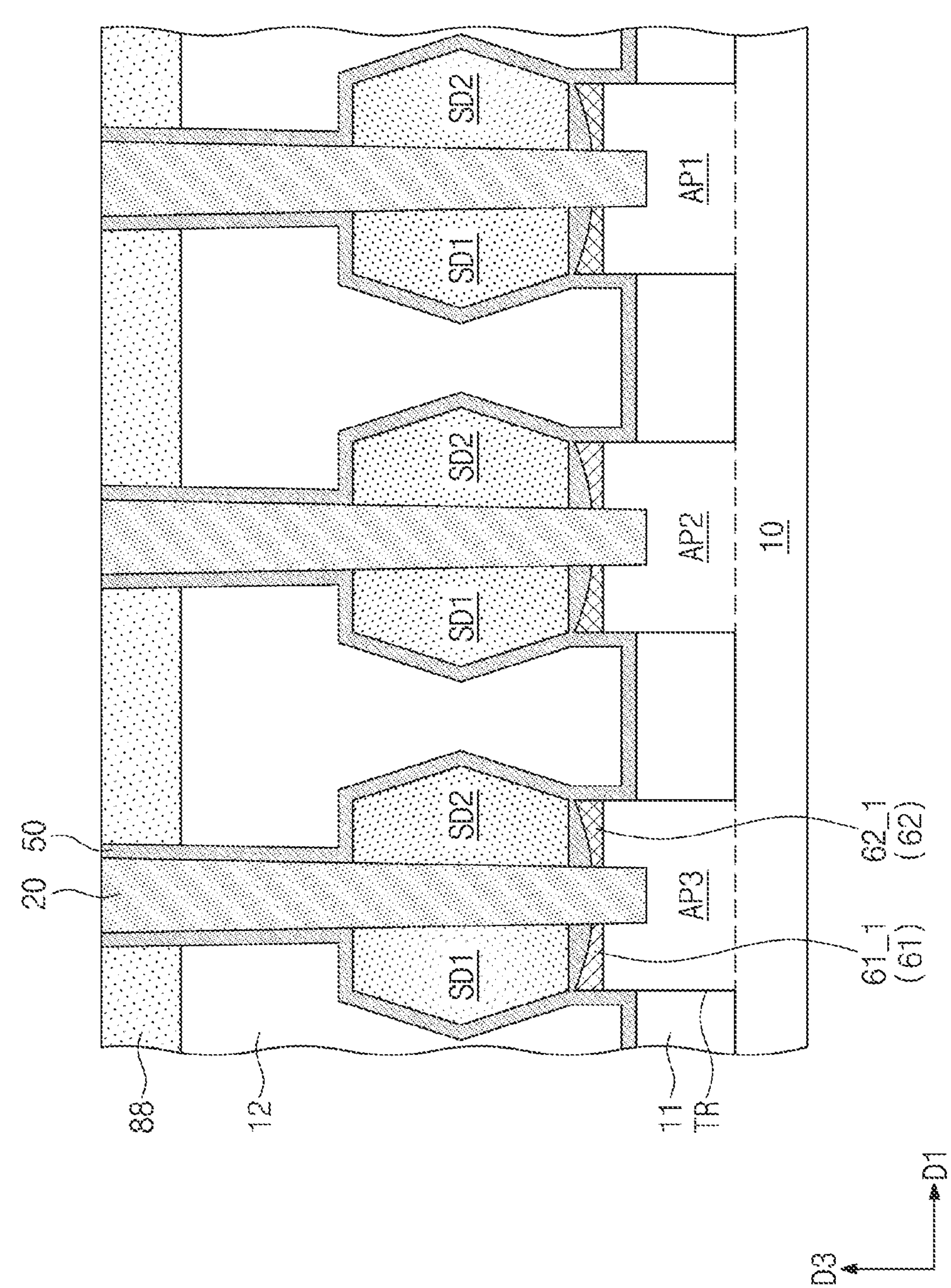
Figure 6B:
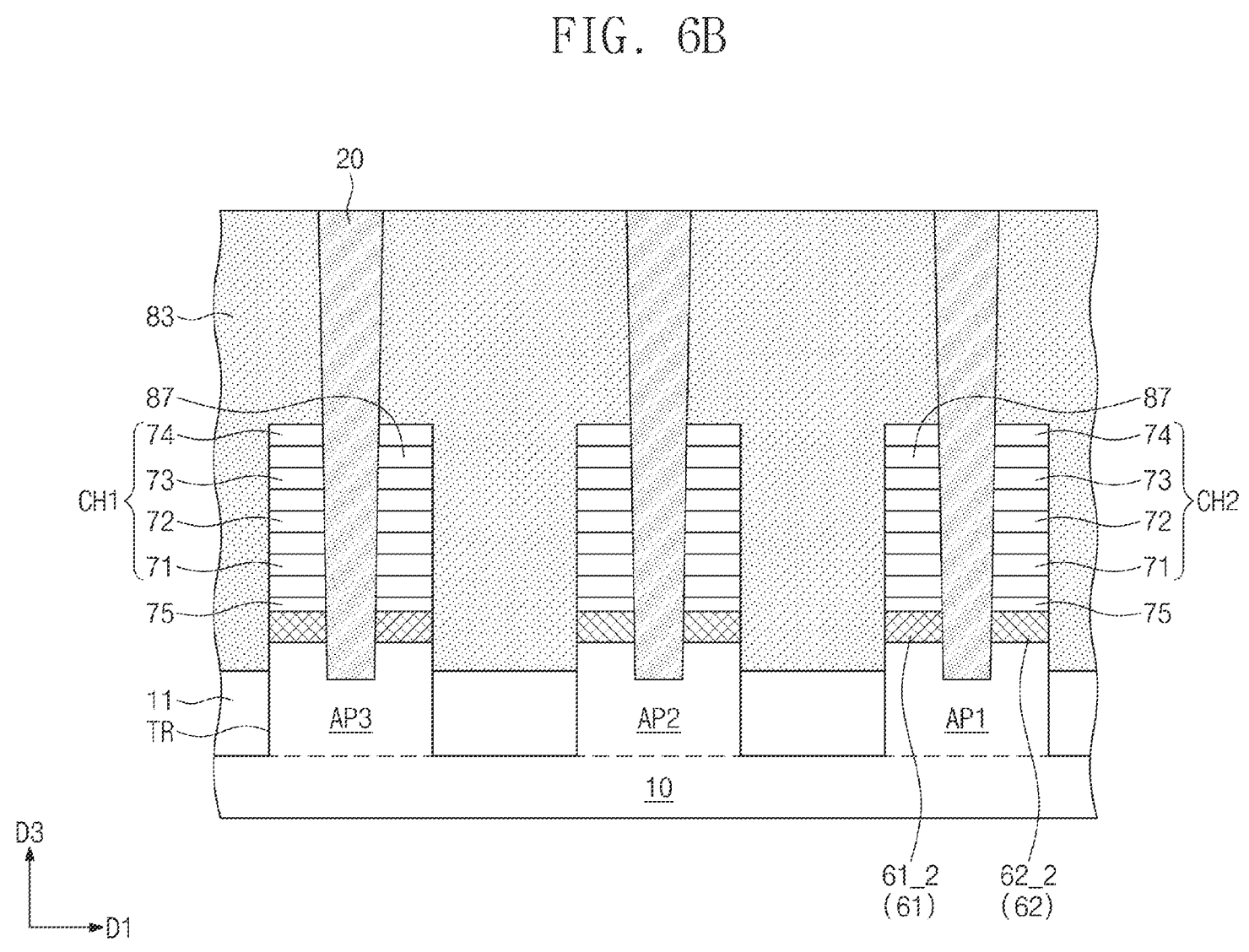
Figure 6C:
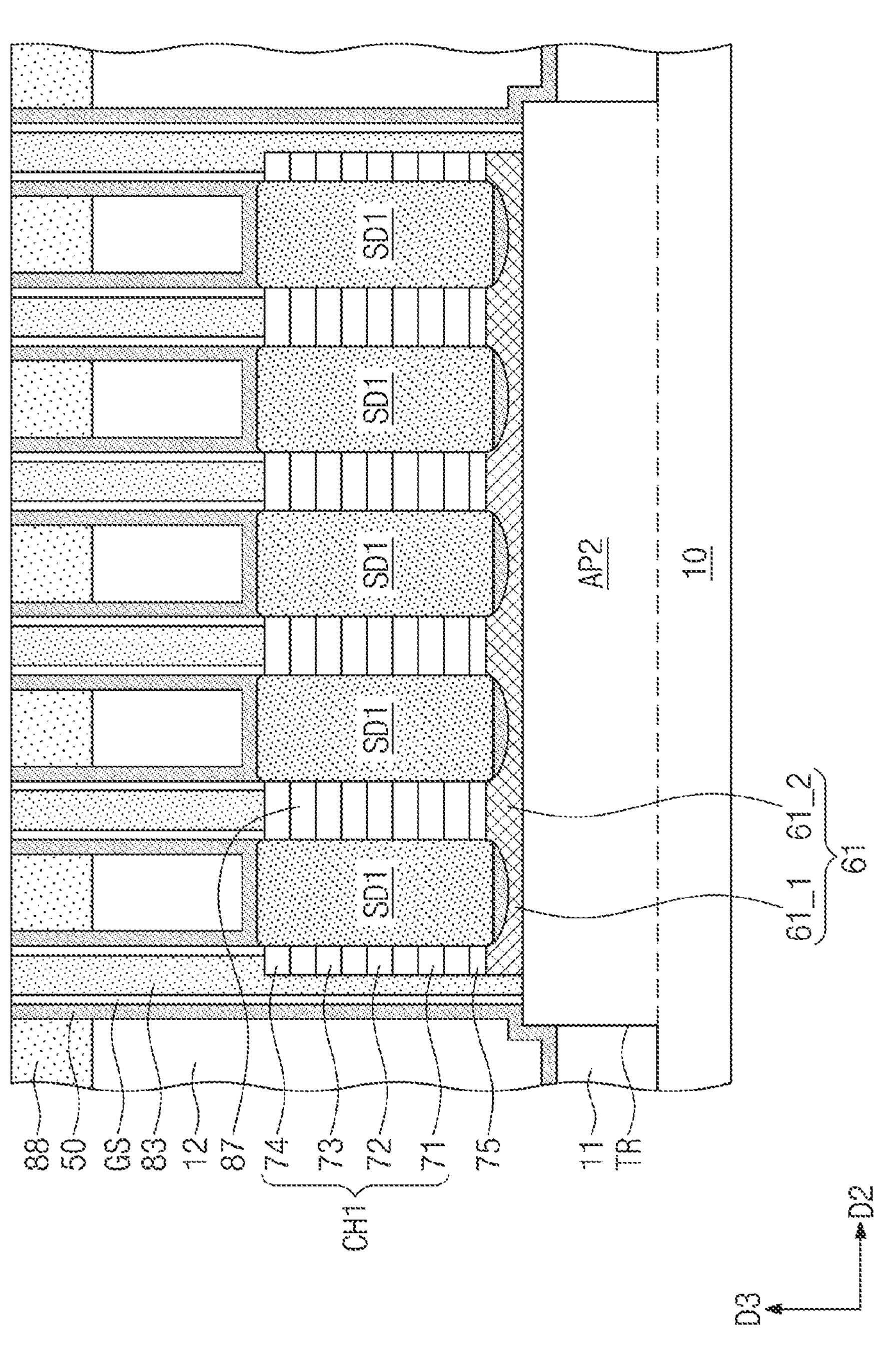
Figure 6D:
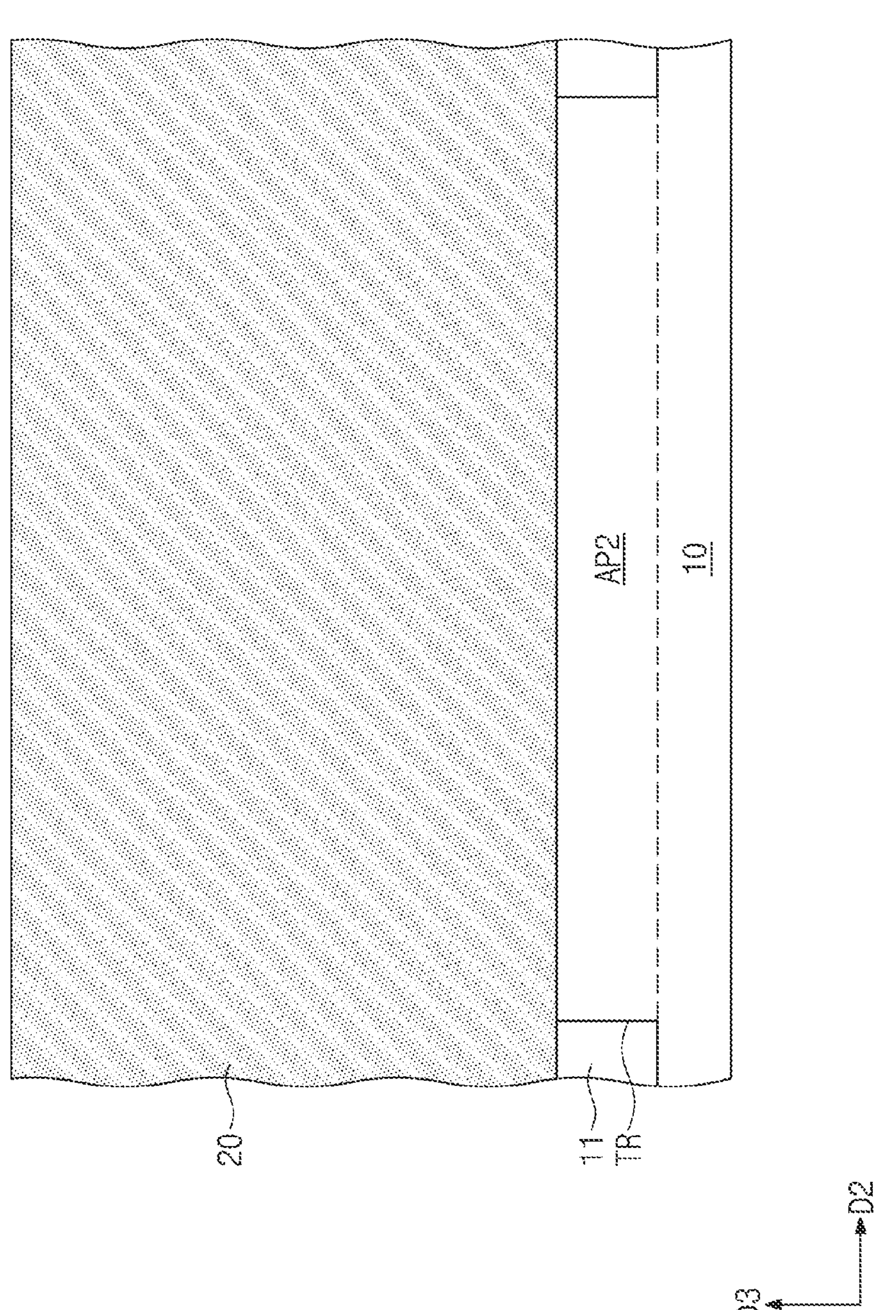
Figure 7A:
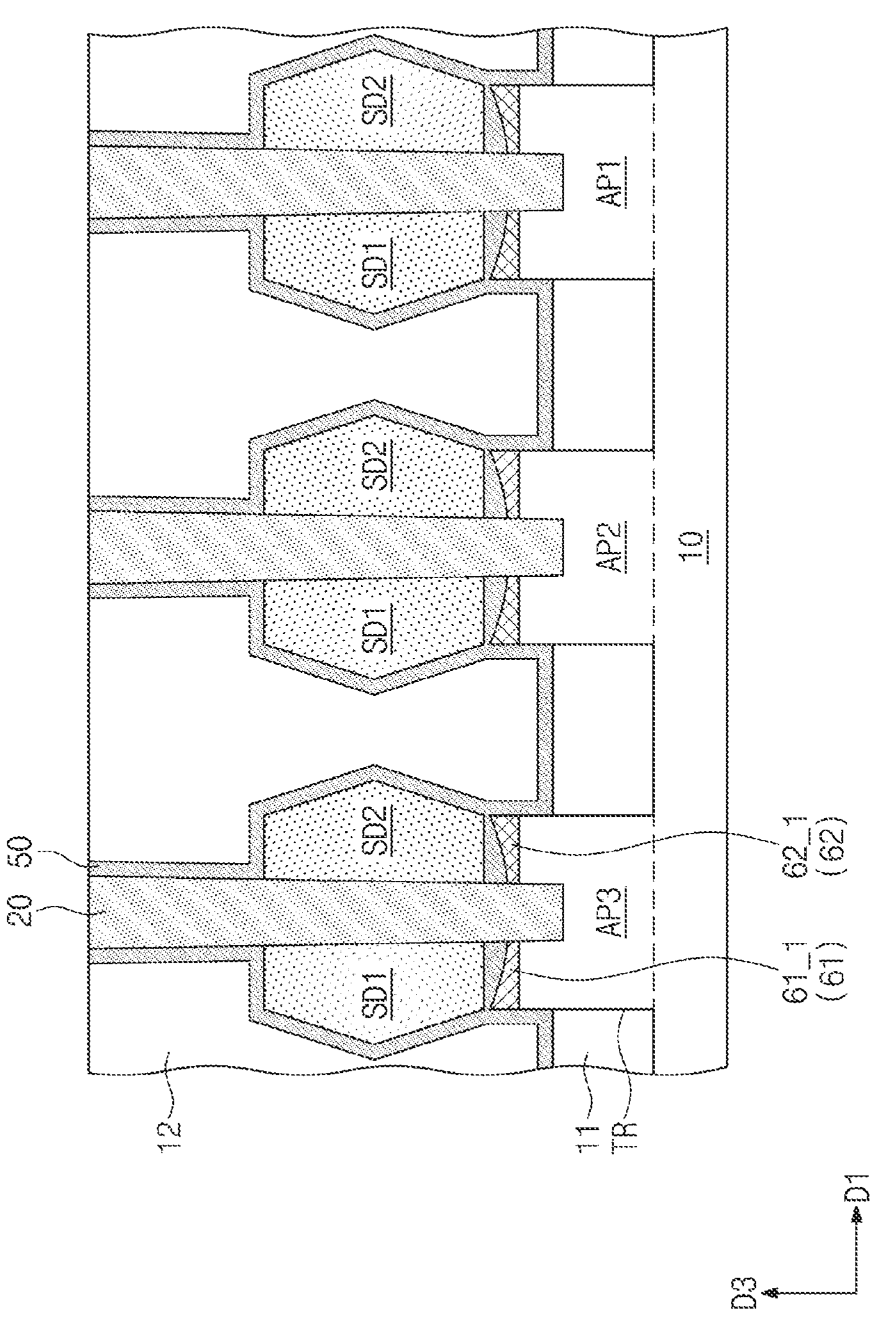
Figure 7B:
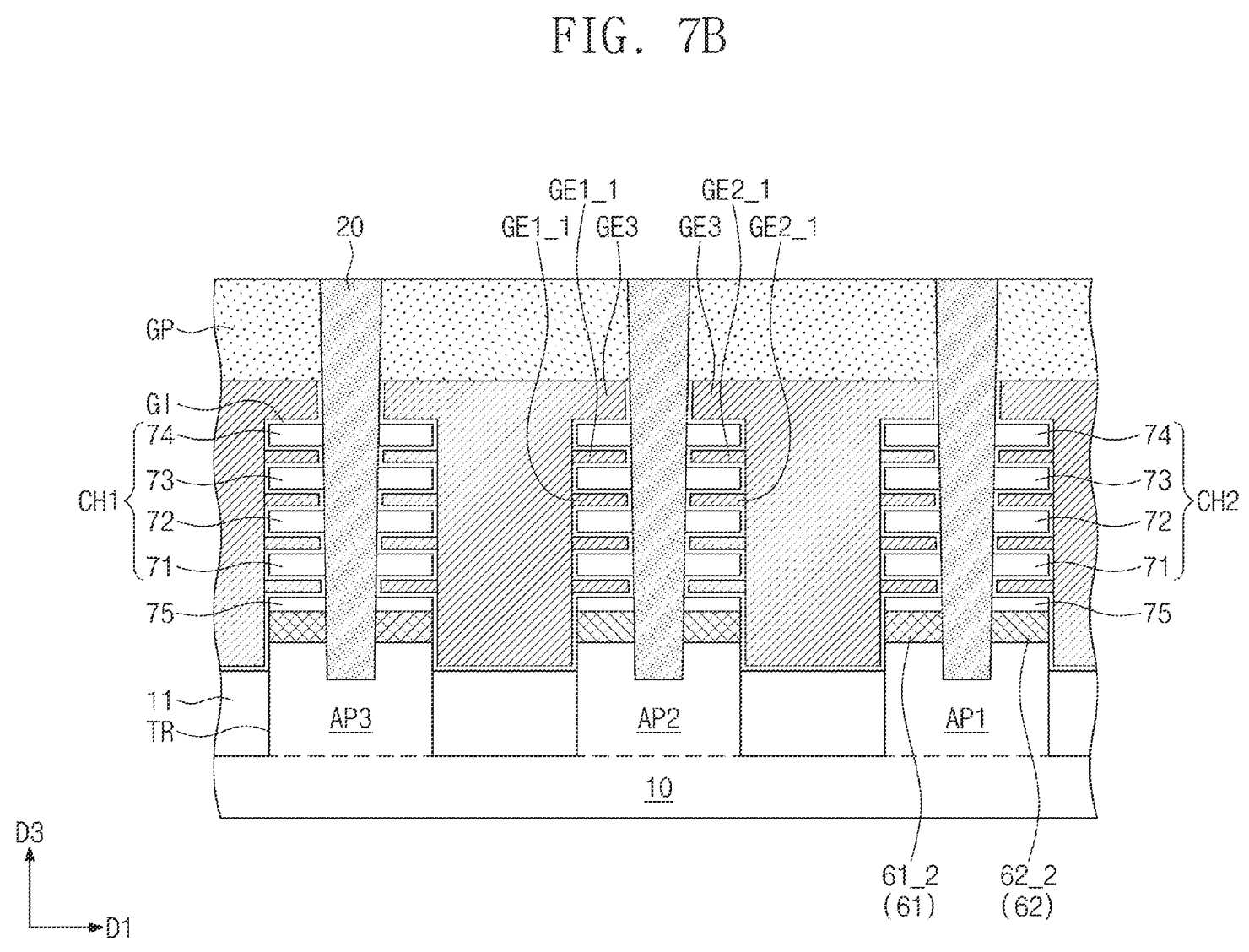
Figure 7C:
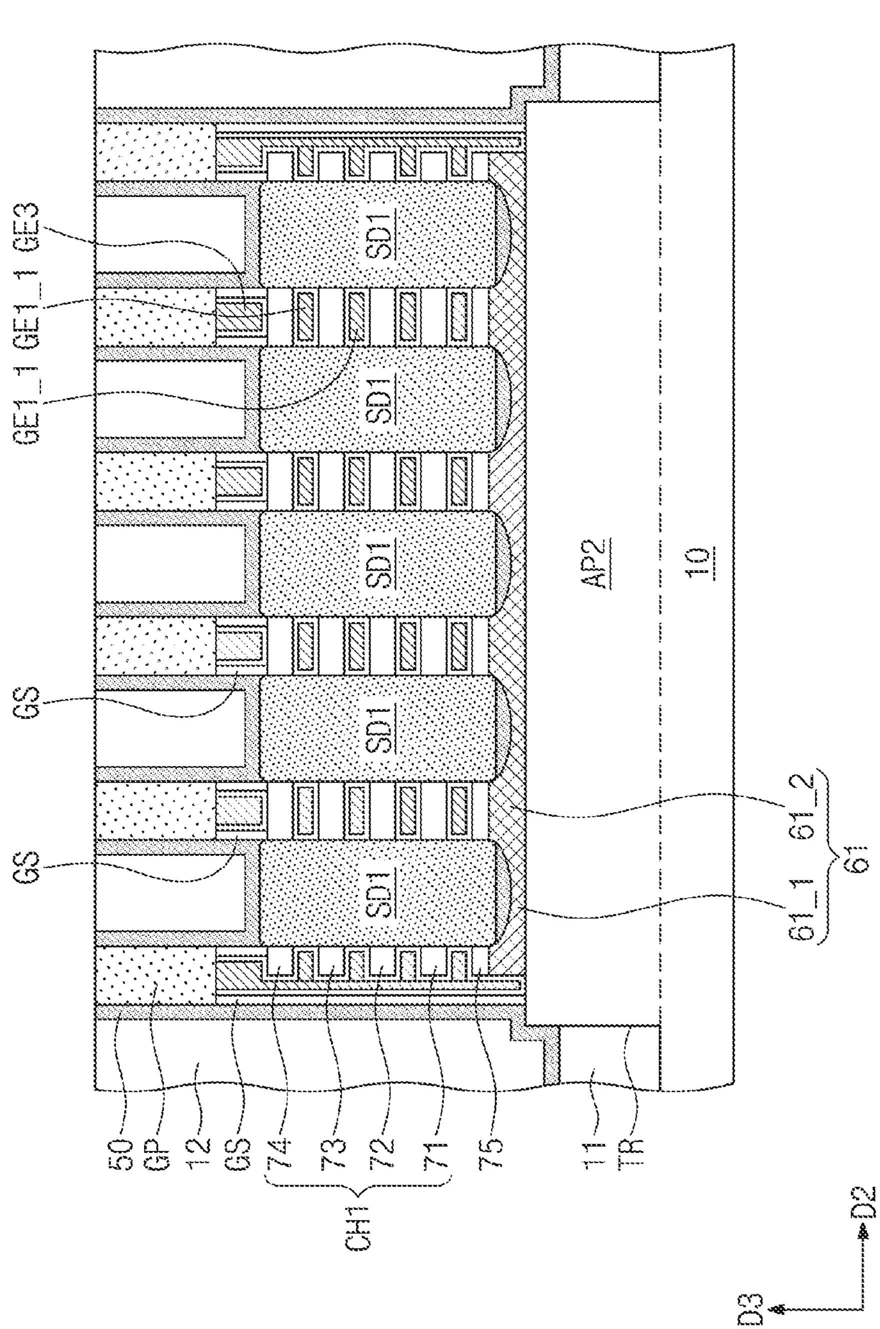
Figure 7D:
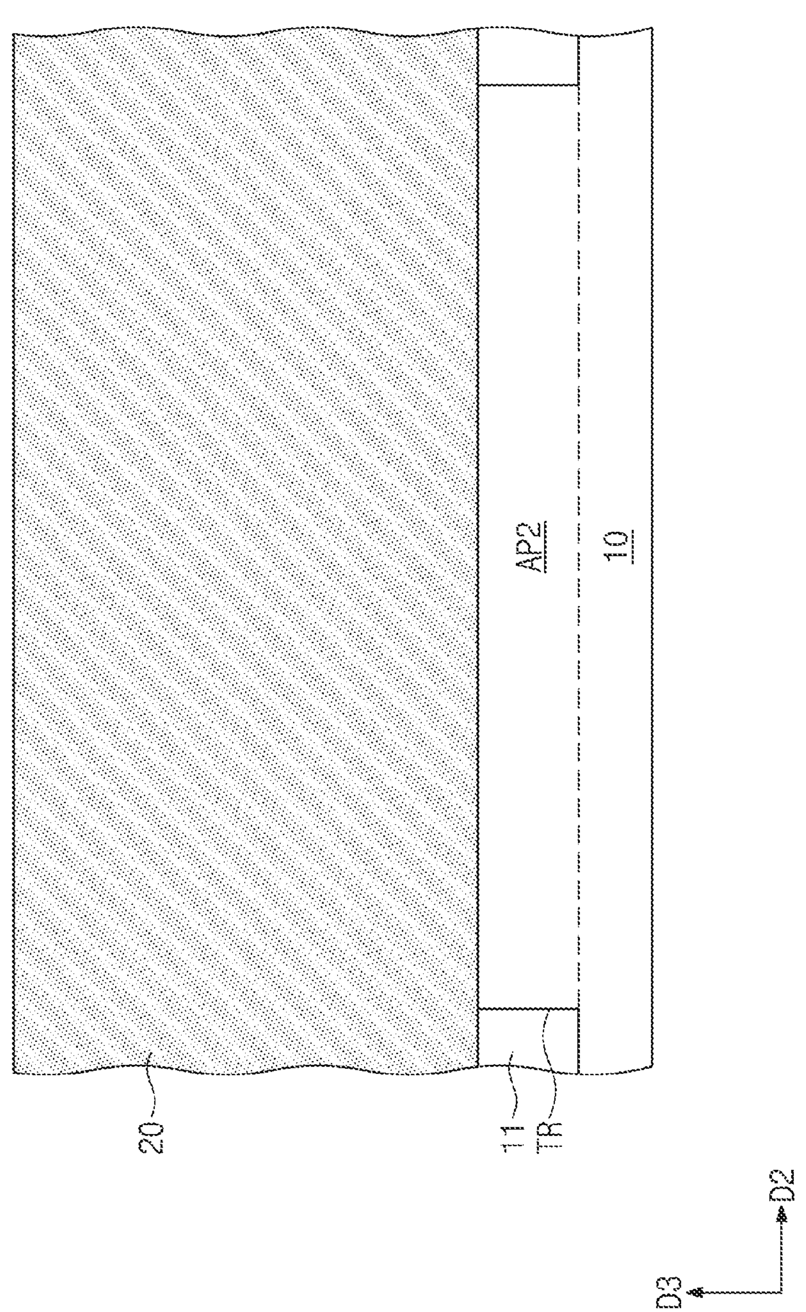

Referring to FIGS. 7A, 7B, 7C and 7D, the sacrificial patterns 83 may be removed. The sacrificial patterns 83 may be removed to expose the sacrificial semiconductor patterns 87, as shown in FIG. 6C. The sacrificial semiconductor patterns 87 may be removed.

A gate insulating layer GI may be formed in empty spaces formed by the removal of the sacrificial semiconductor patterns 87 and the sacrificial patterns 83, as shown in FIG. 7B.

First interposed portions GE1_1 and second interposed portions GE2_1 may be formed in the empty spaces formed by the removal of the sacrificial semiconductor patterns 87. A preliminary plug portion GE3 physically and electrically connected to the first interposed portions GE1_1 and the second interposed portions GE2_1 may be formed. The preliminary plug portion GE3 may include a conductive material different from that of the first interposed portion GE1_1 and the second interposed portion GE2_1.

In various embodiments, gate capping patterns GP may be formed on the preliminary plug portions GE3. The capping insulating layer 88, an upper portion of the cover insulating layer 50 and an upper portion of the separation insulating layer 20 may be removed in the process of forming the gate capping patterns GP. For example, the capping insulating layer 88, the upper portion of the cover insulating layer 50 and the upper portion of the separation insulating layer 20 may be removed by a chemical mechanical polishing (CMP) process.

Figure 8:
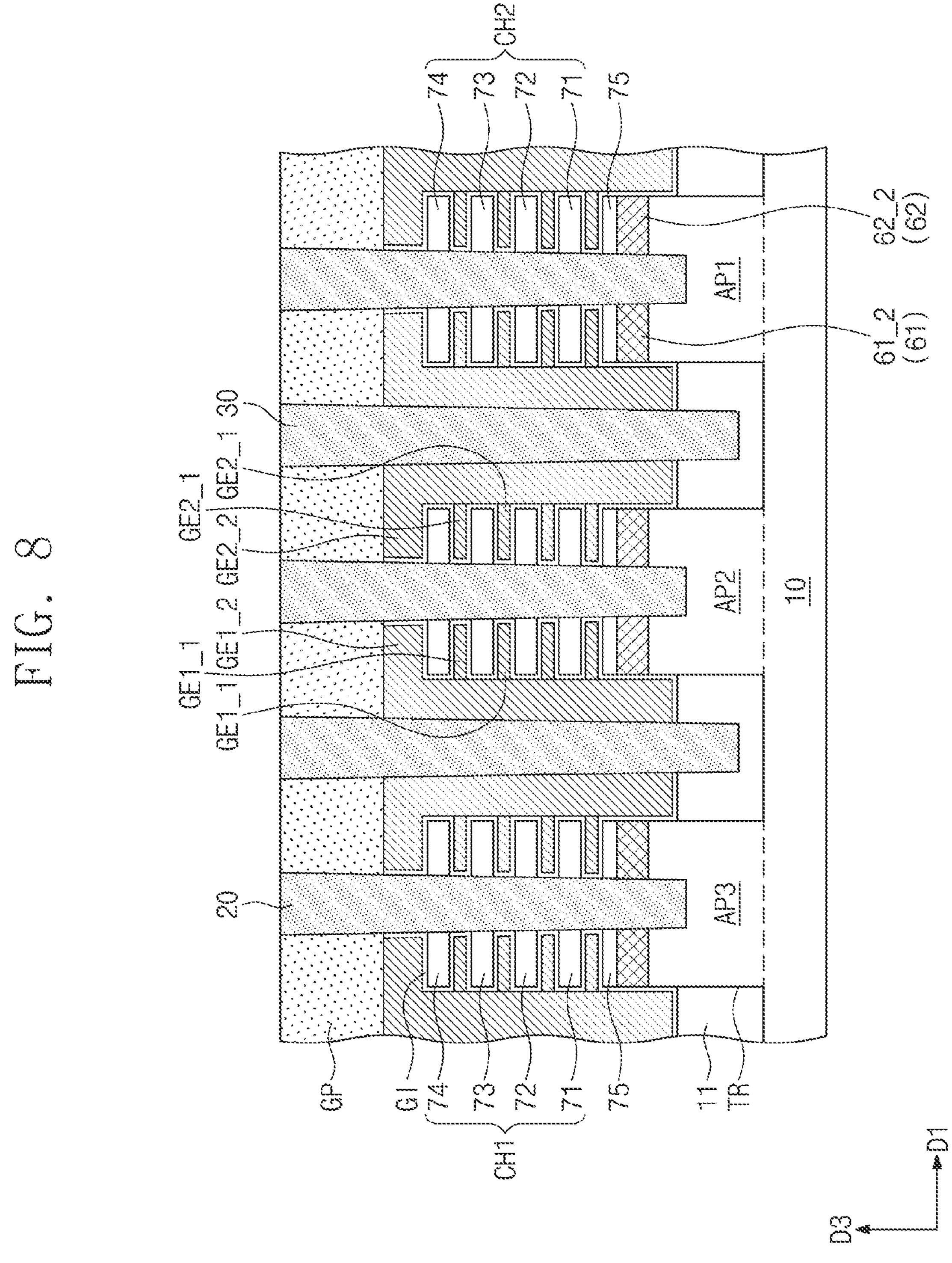

Referring to FIG. 8, gate separation patterns 30 may be formed. The formation of the gate separation pattern 30 may include etching the gate capping pattern GP and the preliminary plug portion GE3 to form an empty space, and forming the gate separation pattern 30 filling the empty space. The preliminary plug portion GE3 may be divided into a first plug portion GE1_2 and a second plug portion GE2_2 by the etching process.

Figure 9:
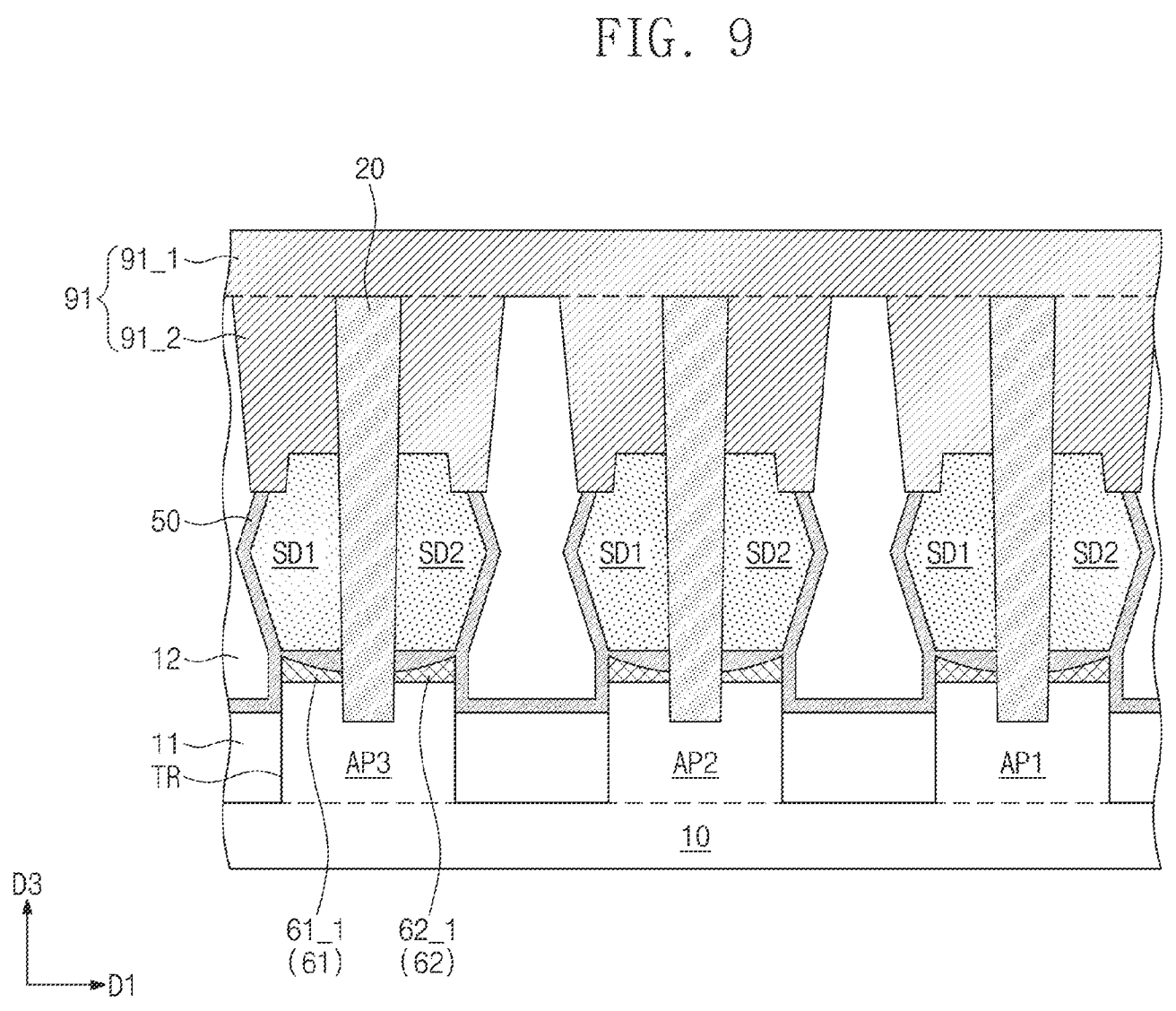

Referring to FIG. 9, an active contact layer 91 may be formed. The formation of the active contact layer 91 may include etching the first insulating layer 12, the cover insulating layer 50, the first source/drain pattern SD1 and the second source/drain pattern SD2 to form empty spaces, and forming the active contact layer 91 filling the empty spaces.

The active contact layer 91 may be in physical contact with a plurality of the separation insulating layers 20. The active contact layer 91 may include an upper portion 91_1 and lower portions 91_2 connected to the upper portion 91_1. The upper portion 91_1 of the active contact layer 91 may be a portion disposed at a higher level than the separation insulating layer 20, where the lower portions 91_2 can be on and in electrical contact with the first source/drain pattern SD1 and the second source/drain pattern SD2. The separation insulating layer 20 may be disposed between the lower portions 91_2 of the active contact layer 91.

Referring to FIGS. 10A, 10B, 10C and 10D, first active contacts 41 and second active contacts 42 may be formed. The formation of the first active contacts 41 and the second active contacts 42 may include removing the upper portion 91_1 of the active contact layer 91 to separate the lower portions 91_2 of the active contact layer 91 from each other by the separation insulating layers 20. The separated lower portions 91_2 of the active contact layer 91 may be defined as the active contacts 41 and 42 on opposite sides of the separation insulating layers 20. For example, the upper portion 91_1 of the active contact layer 91 may be removed by a chemical mechanical polishing (CMP) process. A portion of the lower portion 91_2 of the active contact layer 91 may also be removed together with the upper portion 91_1 of the active contact layer 91.

In various embodiments, an upper portion of the separation insulating layer 20, an upper portion of the gate separation pattern 30, an upper portion of the gate capping pattern GP and an upper portion of the first insulating layer 12 may also be removed in the process of removing the upper portion 91_1 of the active contact layer 91.

Since the upper portion 91_1 of the active contact layer 91 and the upper portion of the separation insulating layer 20 may be removed together, a level of a top surface of the separation insulating layer 20 may be substantially the same as a level of top surfaces of the active contacts 41 and 42, where the top surface of the separation insulating layer 20 may be coplanar with the top surfaces of the active contacts 41 and 42 and the first insulating layer 12.

Figure 10A:
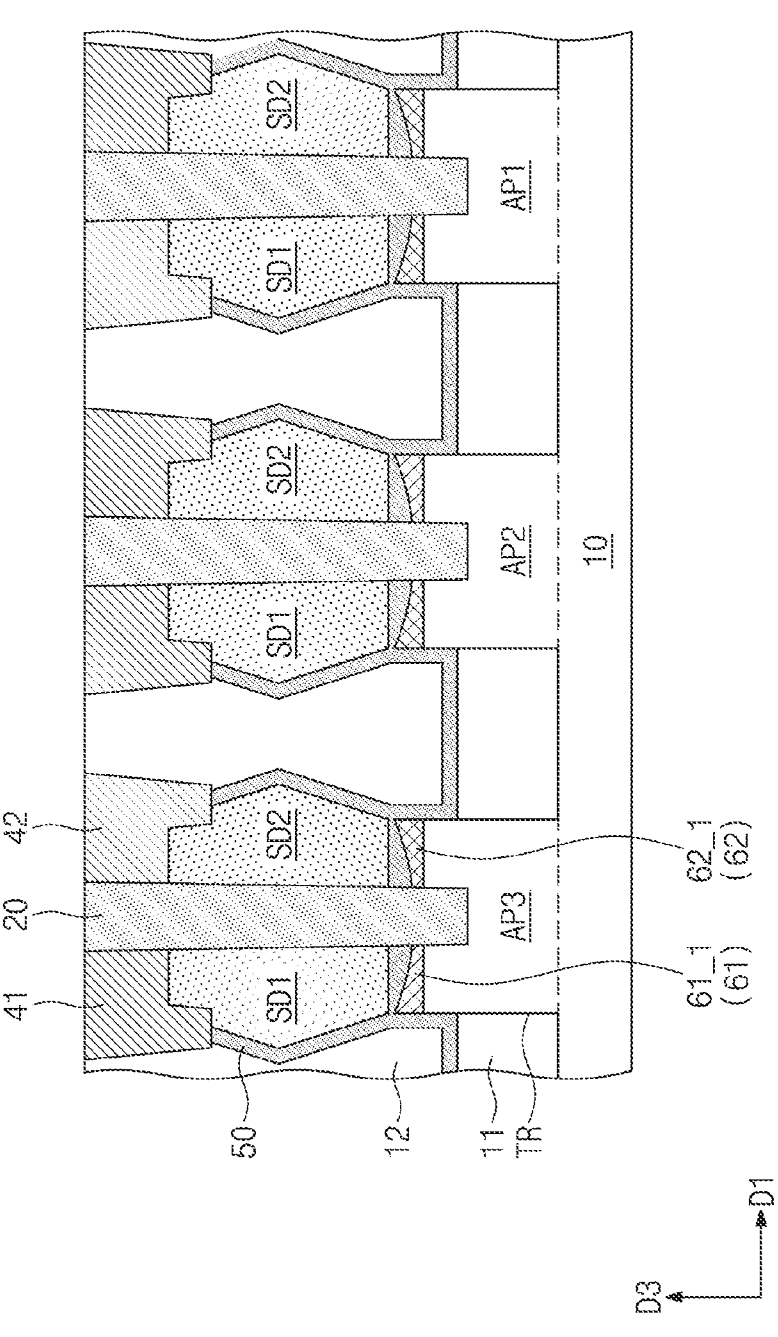
Figure 10B:
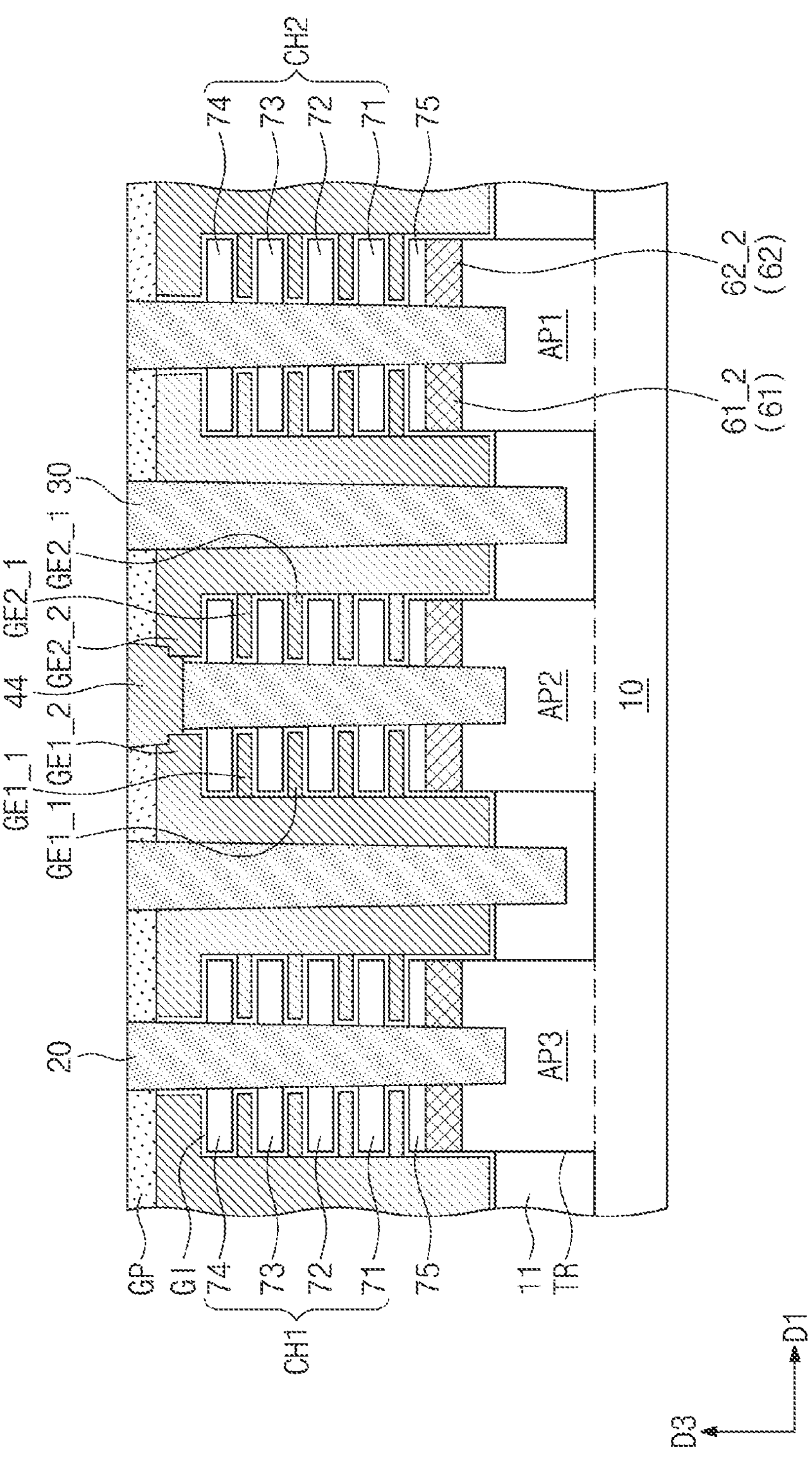
Figure 10C:
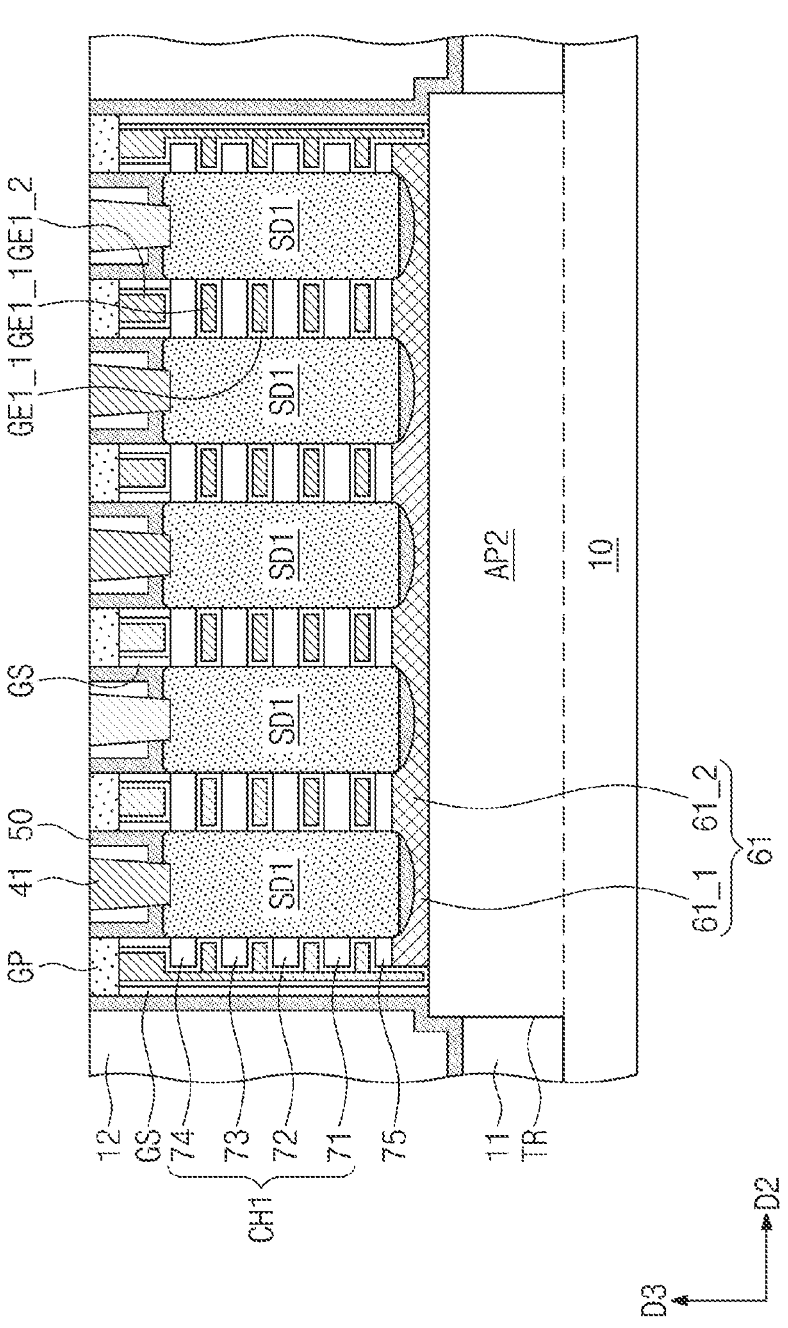
Figure 10D:
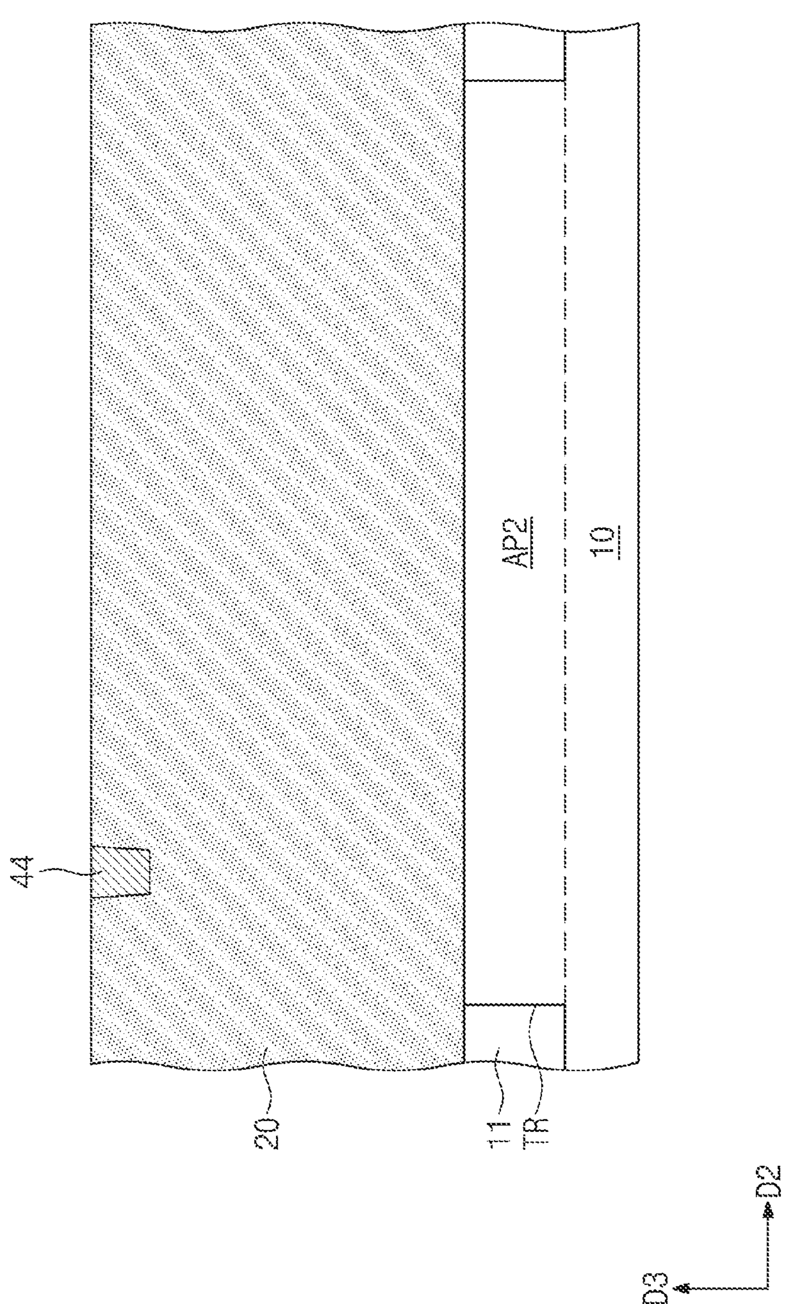

A first gate contact 44 may be formed to penetrate the gate capping pattern GP, as shown in FIG. 10B.

Referring again to FIGS. 1B, 1C, 1D and 1E, a second insulating layer 13 may be formed. Connection contacts 43 and second gate contacts 45 may be formed to penetrate the second insulating layer 13.

In the method of manufacturing the semiconductor device according to the embodiments described above, the upper portion 91_1 of the active contact layer 91 may be removed to form the active contacts 41 and 42, and thus it is possible to prevent a phenomenon in which the active contacts 41 and 42 are not separated from each other. As a result, it may not be necessary to increase a width of the separation insulating layer 20 to separate the active contacts 41 and 42, and thus electrical characteristics of the semiconductor device may be improved.

In various embodiments, the upper portion 91_1 of the active contact layer 91 may be removed to form the active contacts 41 and 42, and thus difficulty of the process of forming the active contacts 41 and 42 may be reduced or minimized.

In various embodiments, the separation insulating layer 20 may be formed after the formation of the sacrificial pattern 83, and thus it is possible to prevent a phenomenon in which a skirt of the sacrificial pattern 83 is formed by the separation insulating layer 20 in the process of forming the sacrificial pattern 83.

In various embodiments, the separation insulating layer 20 may be formed after etching the first semiconductor layer 81, the second semiconductor layer 82, the dummy insulating layer 86 and the lower insulating layer 85, and thus it is possible to reduce or prevent a phenomenon in which the separation insulating layer 20 is damaged in the process of etching the first semiconductor layer 81, the second semiconductor layer 82, the dummy insulating layer 86 and the lower insulating layer 85.

Figure 11:
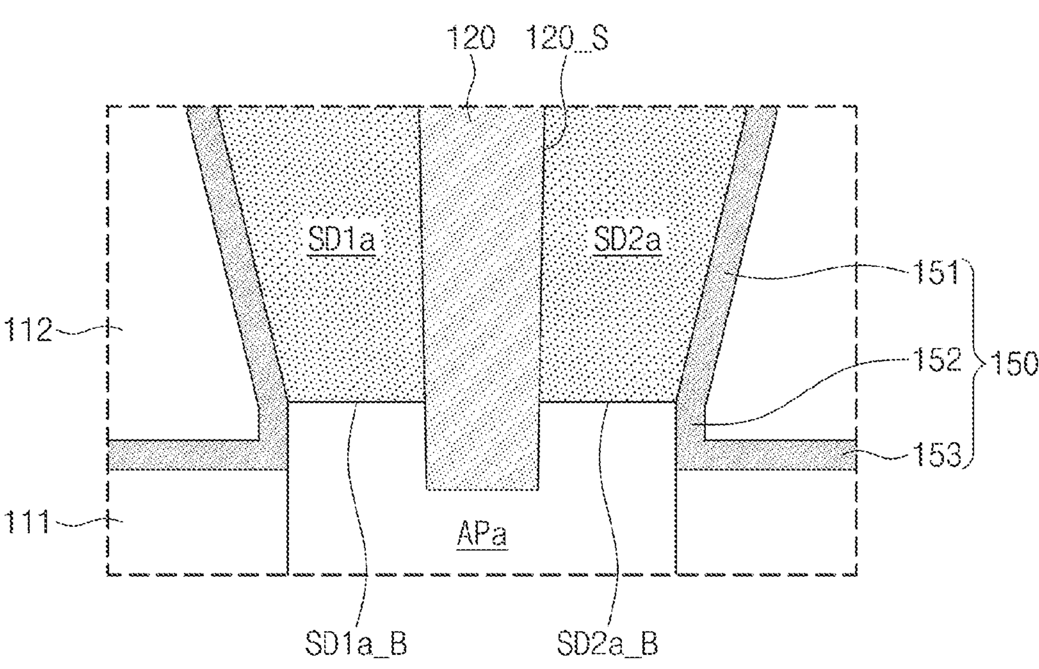
FIG. 11 is an enlarged cross-sectional view illustrating a semiconductor device, according to various embodiments of the inventive concepts.
Figure 11:
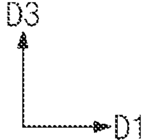

FIG. 11 is an enlarged cross-sectional view illustrating a semiconductor device according to some embodiments of the inventive concepts.

Referring to FIG. 11, a first source/drain pattern SD1*a* and a second source/drain pattern SD2*a* may be formed on an active pattern APa. A bottom surface SD1*a*_B of the first source/drain pattern SD1*a* and a bottom surface SD2*a*_B of the second source/drain pattern SD2*a* may be in direct contact with the active pattern APa.

A sidewall 120_S of a separation insulating layer 120 may be in contact with the first source/drain pattern SD1*a* or the second source/drain pattern SD2*a*.

A cover insulating layer 150 may include a first portion 151, a second portion 152, and a third portion 153. The first portion 151 of the cover insulating layer 150 may be in contact with the first source/drain pattern SD1*a* or the second source/drain pattern SD2*a*. The second portion 152 of the cover insulating layer 150 may be in contact with the active pattern APa. The third portion 153 of the cover insulating layer 150 may be in contact with a device isolation layer 111. An insulating layer 112 may be provided on the cover insulating layer 150. The cover insulating layer 150 may not be between the first source/drain pattern SD1*a* or the second source/drain pattern SD2*a* and the active pattern APa.

Figure 12:
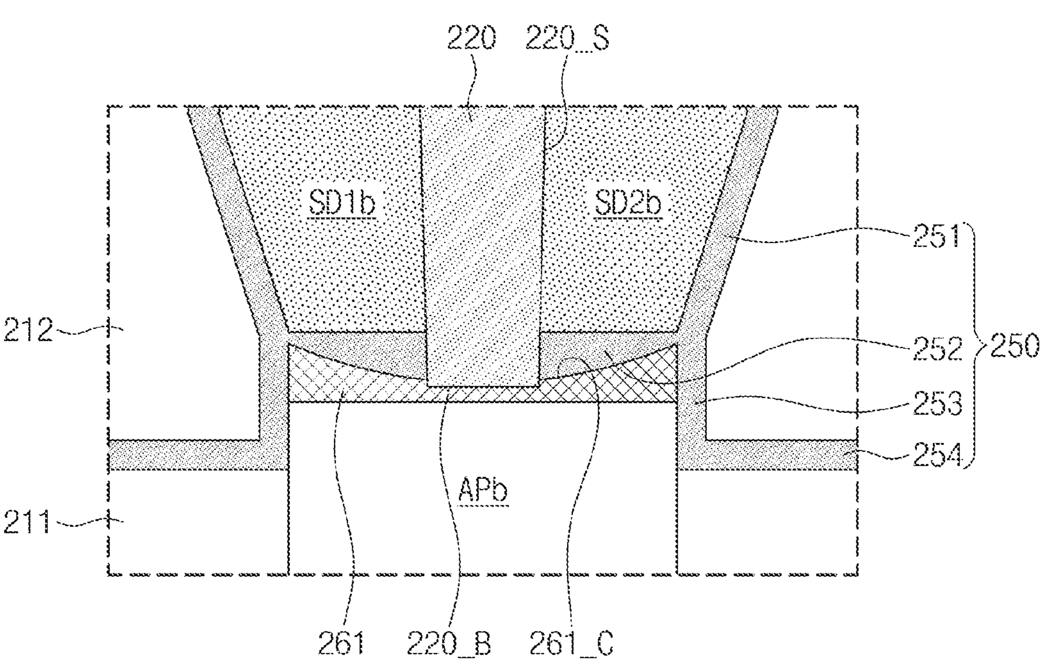
FIG. 12 is an enlarged cross-sectional view illustrating a semiconductor device, according to various embodiments of the inventive concepts.
Figure 12:
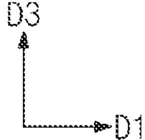

FIG. 12 is an enlarged cross-sectional view illustrating a semiconductor device according to various embodiments of the inventive concepts.

Referring to FIG. 12, a lower insulating pattern 261 may be provided on an active pattern APb. A bottom surface 220_B of a separation insulating layer 220 may be disposed in the lower insulating pattern 261. The bottom surface 220_B of the separation insulating layer 220 may be disposed between a curved surface 261_C and a bottom surface of the lower insulating pattern 261. The separation insulating layer 220 may penetrate the curved surface 261_C of the lower insulating pattern 261. The lower insulating pattern 261 may overlap with a first source/drain pattern SD1*b* and a second source/drain pattern SD2*b* in the third direction D3, where a thickness of the lower insulating pattern 261 can separate the active pattern APb from the bottom surface 220_B of a separation insulating layer 220.

A cover insulating layer 250 may include a first portion 251, a second portion 252, a third portion 253, and a fourth portion 254. The first portion 251 of the cover insulating layer 250 may be in contact with the first source/drain pattern SD1*b* or the second source/drain pattern SD2*b*. The second portion 252 of the cover insulating layer 250 may be disposed between the first source/drain pattern SD1*b* and the lower insulating pattern 261 or between the second source/drain pattern SD2*b* and the lower insulating pattern 261. The second portion 252 of the cover insulating layer 250 may be in contact with a sidewall 220_S of the separation insulating layer 220. The third portion 253 of the cover insulating layer 250 may be in contact with a sidewall of the lower insulating pattern 261 and a sidewall of the active pattern APb. The fourth portion 254 of the cover insulating layer 250 may be in contact with a device isolation layer 211. An insulating layer 212 may be provided on the cover insulating layer 250.

In the semiconductor device according to the embodiments of the inventive concepts, the width of the separation insulating layer separating the source/drain patterns may be relatively small. Thus, the distance between the channel patterns may be relatively small, and the electrical characteristics of the semiconductor device may be improved.

While the embodiments of the inventive concepts have been particularly shown and described, it will be understood by one of ordinary skill in the art that variations in form and detail may be made therein without departing from the spirit and scope of the attached claims.

What is claimed is:

1. A semiconductor device comprising:

a substrate;

an active pattern on the substrate;

a first source/drain pattern and a second source/drain pattern which overlap with the active pattern;

a first active contact on the first source/drain pattern, a second active contact on the second source/drain pattern, a separation insulating layer between the first source/drain pattern and the second source/drain pattern and between the first active contact and the second active contact, the separation insulating layer physically and electrically separating the first active contact from the second active contact;

a first gate electrode and a second gate electrode which are spaced apart from each other with the separation insulating layer interposed therebetween, wherein a level of a top surface of the separation insulating layer is higher than a level of a top surface of the first gate electrode and a level of a top surface of the second gate electrode, and wherein the level of the top surface of the separation insulating layer is substantially the same as a level of a top surface of the first active contact and a level of a top surface of the second active contact.

2. The semiconductor device of claim 1, further comprising:

a lower insulating pattern separating the first source/drain pattern from the active pattern, wherein a sidewall of the lower insulating pattern is in direct contact with a sidewall of the separation insulating layer.

3. The semiconductor device of claim 2, wherein a thickness of the lower insulating pattern becomes less toward the separation insulating layer.

4. The semiconductor device of claim 2, wherein a top surface of the lower insulating pattern is curved.

5. The semiconductor device of claim 2, further comprising:

a cover insulating layer in direct contact with the first source/drain pattern and the lower insulating pattern, wherein the cover insulating layer includes a first portion separating the first source/drain pattern from the lower insulating pattern.

6. The semiconductor device of claim 5, wherein a thickness of the first portion of the cover insulating layer becomes greater toward the separation insulating layer.

7. The semiconductor device of claim 1, wherein a bottom surface of the separation insulating layer is disposed in the active pattern.

8. The semiconductor device of claim 1, further comprising:

semiconductor patterns connected to the first source/drain pattern, wherein the first gate electrode includes: interposed portions between the semiconductor patterns; and a plug portion connected to the interposed portions, and wherein the interposed portions include a conductive material different from that of the plug portion.

9. A semiconductor device comprising:

a substrate including a first active pattern and a second active pattern, which are adjacent to each other;

first source/drain patterns overlapping the first active pattern;

second source/drain patterns overlapping the second active pattern;

a first gate electrode between the first source/drain patterns;

a second gate electrode between the second source/drain patterns;

a first separation insulating layer adjoining the first source/drain patterns;

a second separation insulating layer adjoining the second source/drain patterns; and a gate separation pattern in direct contact with the first and second gate electrodes, wherein the gate separation pattern separates the first and second gate electrodes from each other.

10. The semiconductor device of claim 9, wherein the gate separation pattern is disposed between the first separation insulating layer and the second separation insulating layer.

11. The semiconductor device of claim 9, wherein a level of a top surface of the gate separation pattern is higher than a level of a top surface of the first gate electrode and a level of a top surface of the second gate electrode.

12. The semiconductor device of claim 9, wherein a level of a top surface of the first separation insulating layer and a level of a top surface of the second separation insulating layer are higher than a level of a top surface of the first gate electrode and a level of a top surface of the second gate electrode.

13. The semiconductor device of claim 9, further comprising:

a gate capping pattern on the first gate electrode, wherein a level of a top surface of the gate capping pattern is substantially the same as a level of a top surface of the first separation insulating layer and a level of a top surface of the second separation insulating layer.

14. The semiconductor device of claim 9, further comprising:

a first channel pattern overlapping with the first active pattern; and a second channel pattern overlapping with the second active pattern, wherein each of the first and second channel patterns comprises semiconductor patterns spaced apart from each other, wherein the first gate electrode includes: first interposed portions between the semiconductor patterns of the first channel pattern; and a first plug portion connected to the first interposed portions, wherein the second gate electrode includes: second interposed portions between the semiconductor patterns of the second channel pattern; and a second plug portion connected to the second interposed portions, and wherein the gate separation pattern is in contact with the first plug portion and the second plug portion.

15. The semiconductor device of claim 14, wherein the first interposed portions include a conductive material different from that of the second interposed portions, and wherein the first and second plug portions include a conductive material different from those of the first and second interposed portions.

16. The semiconductor device of claim 9, wherein the first source/drain patterns are spaced apart from each other in a first direction with the first gate electrode interposed therebetween, wherein a width of the gate separation pattern in the first direction is greater than a width of the first gate electrode in the first direction, and wherein the width of the gate separation pattern in the first direction is less than a width of the first separation insulating layer in the first direction.

17. A semiconductor device comprising:

a substrate including an active pattern;

first source/drain patterns overlapping the active pattern;

second source/drain patterns overlapping the active pattern;

a first channel pattern between the first source/drain patterns;

a second channel pattern between the second source/drain patterns;

a first gate electrode between the first source/drain patterns;

a second gate electrode between the second source/drain patterns; and a separation insulating layer between the first source/drain patterns and the second source/drain patterns, and a lower insulating pattern separating the first source/drain patterns and the second source/drain patterns from the active pattern, wherein a sidewall of the lower insulating pattern is in direct contact with a sidewall of the separation insulating layer, and wherein each of the first channel pattern and the second channel pattern comprises semiconductor patterns overlapping with each other in a vertical direction.

18. The semiconductor device of claim 17, wherein the first and second gate electrodes are spaced apart from each other with the separation insulating layer interposed therebetween, and wherein the first and second channel patterns are spaced apart from each other with the separation insulating layer interposed therebetween.

* * * * *